United States Patent
Li et al.

(10) Patent No.: US 12,074,249 B2
(45) Date of Patent: Aug. 27, 2024

(54) QUANTUM DOT LIGHT EMITTING STRUCTURE, METHOD FOR MANUFACTURING THE SAME, ARRAY SUBSTRATE, AND DISPLAY DEVICE

(71) Applicants: BEIJING BOE TECHNOLOGY DEVELOPMENT CO., LTD., Beijing (CN); BOE TECHNOLOGY GROUP CO., LTD., Beijing (CN)

(72) Inventors: Dong Li, Beijing (CN); Zhuo Chen, Beijing (CN)

(73) Assignees: BEIJING BOE TECHNOLOGY DEVELOPMENT CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 680 days.

(21) Appl. No.: 17/270,984

(22) PCT Filed: May 12, 2020

(86) PCT No.: PCT/CN2020/089739
§ 371 (c)(1),
(2) Date: Feb. 24, 2021

(87) PCT Pub. No.: WO2021/226818
PCT Pub. Date: Nov. 18, 2021

(65) Prior Publication Data
US 2022/0123168 A1    Apr. 21, 2022

(51) Int. Cl.
*H01L 33/06* (2010.01)
*H01L 33/00* (2010.01)
(Continued)

(52) U.S. Cl.
CPC ............ *H01L 33/06* (2013.01); *H01L 33/005* (2013.01); *H01L 33/14* (2013.01); *H10K 50/15* (2023.02); *H10K 71/00* (2023.02)

(58) Field of Classification Search
None
See application file for complete search history.

(56) References Cited

U.S. PATENT DOCUMENTS

| | | |
|---|---|---|
| 10,505,115 B2 | 12/2019 | Li et al. |
| 11,495,767 B2 | 11/2022 | Hosono et al. |

(Continued)

FOREIGN PATENT DOCUMENTS

| | | |
|---|---|---|
| CN | 103904178 A | 7/2014 |
| CN | 105679958 A | 6/2016 |

(Continued)

OTHER PUBLICATIONS

First Chinese Office Action from Chinese Patent Application No. 202080000717 dated Apr. 25, 2022.

(Continued)

*Primary Examiner* — Michael Lebentritt
(74) *Attorney, Agent, or Firm* — Dilworth & Barrese, LLP.; Michael J. Musella, Esq.

(57) ABSTRACT

A quantum dot light emitting structure and a method for manufacturing the same, an array substrate, and a display device are disclosed. The quantum dot light emitting structure includes a quantum dot light emitting layer, an electrode, and an electron transport layer located between the quantum dot light emitting layer and the electrode; the quantum dot light emitting structure further includes an electron blocking layer located in the electron transport layer.

16 Claims, 5 Drawing Sheets

(51) Int. Cl.
*H01L 33/14* (2010.01)
*H10K 50/15* (2023.01)
*H10K 71/00* (2023.01)

(56) References Cited

U.S. PATENT DOCUMENTS

| | | | |
|---|---|---|---|
| 2014/0158993 A1 | 6/2014 | So et al. | |
| 2016/0149150 A1 | 5/2016 | Seo et al. | |
| 2016/0204371 A1* | 7/2016 | Kim .................. | H10K 50/16 257/40 |
| 2017/0271549 A1 | 9/2017 | Xu et al. | |
| 2017/0373266 A1 | 12/2017 | Xu et al. | |
| 2018/0205030 A1 | 7/2018 | Meng et al. | |
| 2019/0006589 A1 | 1/2019 | Senkovskyy et al. | |
| 2019/0051849 A1 | 2/2019 | Zhou | |
| 2020/0343467 A1 | 10/2020 | Li | |
| 2021/0043864 A1 | 2/2021 | Li | |

FOREIGN PATENT DOCUMENTS

| | | | |
|---|---|---|---|
| CN | 105810848 A | 7/2016 | |
| CN | 106601922 A | 4/2017 | |
| CN | 106654027 A | 5/2017 | |
| CN | 107910449 A | 4/2018 | |
| CN | 109346506 A | 2/2019 | |
| CN | 109728179 A | 5/2019 | |
| CN | 109768172 A | 5/2019 | |
| CN | 110571343 A | 12/2019 | |
| JP | 2003197371 A | 7/2003 | |
| JP | 2019500752 A | 1/2019 | |
| JP | 2019505946 A | 2/2019 | |
| WO | WO-2019000492 A1 * | 1/2019 | ......... H01L 51/5004 |
| WO | 2020008839 A1 | 1/2020 | |

OTHER PUBLICATIONS

Extended European Search Report from European Patent Application No. 20904232.4 dated Jan. 17, 2023.

"Balancing the Electron and Hole Transfer for Efficient Quantum Dot Light-Emitting Diodes by Employing a Versatile Organic Electron-Blocking Layer," Jin et al., Research Article, Published May 9, 2018, ACS Publications.

Japanese Office Action from Japanese Application No. 2022-502984; Mailing Date: Mar. 18, 2024.

* cited by examiner

QUANTUM DOT LIGHT EMITTING STRUCTURE, METHOD FOR MANUFACTURING THE SAME, ARRAY SUBSTRATE, AND DISPLAY DEVICE

TECHNICAL FIELD

Embodiments of the present disclosure relate to a quantum dot light emitting structure, a method for manufacturing the same, an array substrate, and a display device.

BACKGROUND

With continuous development of display technologies, types of display devices have become more and more. A light emitting diode (LED) display device has received widespread attention from the industry due to its advantages such as self-illumination, high luminance, low work voltage, low power consumption, long service life, impact resistance, and stable performance. Because the LED display device does not need to be additionally provided with a backlight module, it has a lighter weight, which facilitates thinning of the display device, and accordingly has a good market prospect.

A quantum dot (QD) is a novel luminescent material, with the advantages such as high light color purity, high luminescent quantum efficiency, adjustable light color, and long service life, and has become the current research hotspot of novel LED luminescent materials. Therefore, a quantum dot light emitting diode (QLED) using a quantum dot material as a light emitting layer has become the main direction of current research on novel display devices.

SUMMARY

Embodiments of the present disclosure provide a quantum dot light emitting structure, a method for manufacturing the same, an array substrate, and a display device. The quantum dot light emitting structure includes a quantum dot light emitting layer, an electrode, and an electron transport layer located between the quantum dot light emitting layer and the electrode; the quantum dot light emitting structure further includes an electron blocking layer located in the electron transport layer. Thus, by adding the electron blocking layer in the electron transport layer, the electrons injected into the electron transport layer from the electrode may be reduced, a carrier concentration of the quantum dot light emitting layer may be balanced, and the luminous efficiency of the quantum dot light emitting structure may be improved.

At least one embodiment of the present disclosure provides a quantum dot light emitting structure, which includes: a quantum dot light emitting layer; an electrode; and an electron transport layer located between the quantum dot light emitting layer and the electrode, the quantum dot light emitting structure further includes an electron blocking layer located in the electron transport layer.

For example, in the quantum dot light emitting structure provided by an embodiment of the present disclosure, the electron transport layer includes two electron transport sub-layers, and the electron blocking layer is located between the two electron transport sub-layers.

For example, in the quantum dot light emitting structure provided by an embodiment of the present disclosure, the electron transport layer includes N+1 electron transport sub-layers, the electron blocking layer includes N electron blocking sub-layers, the N electron blocking sub-layers are respectively sandwiched among the N+1 electron transport sub-layers, and N is a positive integer equal to or greater than 2.

For example, in the quantum dot light emitting structure provided by an embodiment of the present disclosure, the electron transport layer includes a zinc oxide (ZnO) thin film.

For example, in the quantum dot light emitting structure provided by an embodiment of the present disclosure, each of the electron transport sub-layers is a ZnO thin film.

For example, in the quantum dot light emitting structure provided by an embodiment of the present disclosure, an energy level of conduction band minimum of the electron blocking layer is greater than an energy level of conduction band minimum of the quantum dot light emitting layer.

For example, in the quantum dot light emitting structure provided by an embodiment of the present disclosure, a material of the electronic blocking layer includes at least one selected from the group consisting of aluminum oxide, tantalum oxide, and hafnium oxide.

For example, in the quantum dot light emitting structure provided by an embodiment of the present disclosure, a luminance of the quantum dot light emitting structure under a voltage of 7V is greater than 500 cd/m2.

For example, in the quantum dot light emitting structure provided by an embodiment of the present disclosure, a range of a root-mean-square (RMS) roughness of a surface, close to the quantum dot light emitting layer, of the electron transport layer, is about 5 to 10 nm.

For example, in the quantum dot light emitting structure provided by an embodiment of the present disclosure, a thickness of the electron blocking layer, in a direction perpendicular to a substrate, is about 1 nm to 2 nm.

For example, in the quantum dot light emitting structure provided by an embodiment of the present disclosure, the electron transport layer includes a first electron transport sub-layer and a second electron transport sub-layer, the second transport sub-layer is arranged on a side, close to the quantum dot light emitting layer, of the first electron transport sub-layer, and an energy level of conduction band minimum of the second electron transport sub-layer is greater than that of the first electron transport sub-layer and less than an energy level of conduction band minimum of the quantum dot light emitting layer.

For example, in the quantum dot light emitting structure provided by an embodiment of the present disclosure, the electron blocking layer is arranged between the first electron transport sub-layer and the second electron transport sub-layer.

For example, in the quantum dot light emitting structure provided by an embodiment of the present disclosure, the electron blocking layer is arranged in the second electron transport sub-layer.

For example, in the quantum dot light emitting structure provided by an embodiment of the present disclosure, the first electron transport sub-layer is a ZnO thin film, and the second electron transport sub-layer is a doped ZnO thin film.

For example, in the quantum dot light emitting structure provided by an embodiment of the present disclosure, a doping material of the second electron transport sub-layer includes at least one selected from the group consisting of Mg, Al, Zr, Hf, and Y.

For example, in the quantum dot light emitting structure provided by an embodiment of the present disclosure, the doping material of the second electron transport sub-layer is Mg, and a mole percent of Mg in the second electron transport sub-layer ranges from 1% to 20%.

For example, in the quantum dot light emitting structure provided by an embodiment of the present disclosure, a doping concentration of the second electron transport sub-layer is gradually increased, from a side, close to the first electron transport sub-layer, of the second electron transport sub-layer, to a side, close to the quantum dot light emitting layer, of the second electron transport sub-layer.

For example, in the quantum dot light emitting structure provided by an embodiment of the present disclosure, the second electron transport sub-layer includes a plurality of doped electron transport sub-layers, doping concentrations of the plurality of doped electron transport sub-layers are gradually increased in a direction from the first electron transport sub-layer to the quantum dot light emitting layer.

At least one embodiment of the present disclosure further provides an array substrate, which includes a plurality of light emitting elements; at least one of the light emitting elements adopts any one of the abovementioned quantum dot light emitting structures.

For example, in the array substrate provided by an embodiment of the present disclosure, the electron transport layer includes a first electron transport sub-layer and a second electron transport sub-layer, the second electron transport sub-layer is arranged on a side, close to the quantum dot light emitting layer, of the first electron transport sub-layer, an energy level of conduction band minimum of the second electron transport sub-layer is greater than an energy level of conduction band minimum of the first electron transport sub-layer and less than an energy level of conduction band minimum of the quantum dot light emitting layer, the first electron transport sub-layer is a ZnO thin film, and the second electron transport sub-layer is a doped ZnO thin film; the plurality of light emitting elements include light emitting elements of different colors, and doping concentrations of the second transport sub-layers, in the light emitting elements of different colors, are different.

For example, in the array substrate provided by an embodiment of the present disclosure, a dopant of the doped ZnO thin film is Mg, the plurality of light emitting elements include a red light emitting element, a green light emitting element, and a blue light emitting element, a doping concentration of Mg, in the second electron transport sub-layer, of the red light emitting element is 1% to 5%, a doping concentration of Mg, in the second electron transport sub-layer, of the green light emitting element is 5% to 10%, and a doping concentration of Mg, in the second electron transport sub-layer, of the blue light emitting element is 10% to 20%.

For example, in the array substrate provided by an embodiment of the present disclosure, the array substrate further includes: a pixel definition layer, arranged around the electron transport layer of each of the plurality of light emitting elements, the pixel definition layer covers edges of the electron transport layer of each of the plurality of light emitting elements, and has an opening that exposes a middle of the electron transport layer of each of the plurality of light emitting elements.

At least one embodiment of the present disclosure further provides a display device, which includes any one of the abovementioned array substrate.

At least one embodiment of the present disclosure further provides a method for manufacturing a quantum dot light emitting structure, which includes: forming a first electrode; forming an electron transport layer on the first electrode; and forming a quantum dot light emitting layer, on a side, away from the first electrode, of the electron transport layer, the method further includes forming an electron blocking layer in the electron transport layer.

For example, in the method for manufacturing the quantum dot light emitting structure provided by an embodiment of the present disclosure, forming the electron transport layer on the first electrode includes: forming the electron transport layer on the first electrode by a sputtering process.

For example, in the method for manufacturing the quantum dot light emitting structure provided by an embodiment of the present disclosure, the electron transport layer includes two electron transport sub-layers, and forming the electron blocking layer in the electron transport layer includes: forming the electron blocking layer between the two electron transport sub-layers.

For example, in the method for manufacturing the quantum dot light emitting structure provided by an embodiment of the present disclosure, the electron transport layer includes N+1 electron transport sub-layers, and forming the electron blocking layer in the electron transport layer includes: forming N electron blocking sub-layers among the N+1 electron transport sub-layers, wherein N is a positive integer equal to or greater than 2.

For example, in the method for manufacturing the quantum dot light emitting structure provided by an embodiment of the present disclosure, forming the electron transport layer on the first electrode includes: forming the first electron transport sub-layer and the second electron transport sub-layer by a sputtering process, the second electron transport sub-layer is arranged on a side, close to the quantum dot light emitting layer, of the first electron transport sub-layer, and an energy level of conduction band minimum of the second electron transport sub-layer is greater than that of the first electron transport sub-layer and less than an energy level of conduction band minimum of the quantum dot light emitting layer.

For example, in the method for manufacturing the quantum dot light emitting structure provided by an embodiment of the present disclosure, forming the electron blocking layer in the electron transport layer includes: forming the electron blocking layer in the electron transport layer by a sputtering process.

For example, in the method for manufacturing the quantum dot light emitting structure provided by an embodiment of the present disclosure, forming the quantum dot light emitting layer on a side, away from the first electrode, of the electron transport layer includes: forming the quantum dot light emitting layer on a side, away from the electrode, of the electron transport layer by an ink-jet printing process.

For example, in the method for manufacturing the quantum dot light emitting structure provided by an embodiment of the present disclosure, after the electron transport layer and the electron blocking layer are formed on the first electrode, and before the quantum dot light emitting layer is formed on the side, away from the electrode, of the electron transport layer, the method further includes: forming a pixel definition layer on a side, away from the first electrode, of the electron transport layer, and the pixel definition layer including an opening that exposes the electron transport layer, forming the quantum dot light emitting layer on a side, away from the electrode, of the electron transport layer, includes: forming the quantum dot light emitting layer in the opening by the ink-jet printing process.

For example, in the method for manufacturing the quantum dot light emitting structure provided by an embodiment of the present disclosure, the method further includes: sequentially forming, by an evaporation process, a hole transport layer, a hole injection layer, and a second electrode in the opening, and on a side, away from the first electrode, of the quantum dot light emitting layer.

For example, in the method for manufacturing the quantum dot light emitting structure provided by an embodiment of the present disclosure, the method further includes: roughening a surface, close to the quantum dot light emitting layer, of the electron transport layer by a plasma etching or sandblasting treatment process, wherein a range of a root-mean-square (RMS) roughness of the treated surface, close to the quantum dot light emitting layer, of the electron transport layer, is 5 nm to 10 nm.

At least one embodiment of the present disclosure further provides a method for manufacturing a quantum dot light emitting structure, which includes: forming an electrode; forming an electron transport layer on the electrode by a spluttering process; and forming a quantum dot light emitting layer on a side, away from the electrode, of the electron transport layer, the electron transport layer includes a doped ZnO thin film formed by spluttering.

For example, in the method for manufacturing the quantum dot light emitting structure provided by an embodiment of the present disclosure, forming the electron transport layer on the electrode by the spluttering process includes: forming the ZnO thin film on the electrode by using a ZnO target with an argon flow about 30 sccm to 50 sccm and a sputtering power about 90 W to 110 W.

For example, in the method for manufacturing the quantum dot light emitting structure provided by an embodiment of the present disclosure, forming the electron transport layer on the electrode by the spluttering process includes: forming a first electron transport sub-layer and the second electron transport sub-layer by the spluttering process, the second electron transport sub-layer is arranged on a side, close to the quantum dot light emitting layer, of the first electron transport sub-layer, and an energy level of conduction band minimum of the second electron transport sub-layer is greater than an energy level of conduction band minimum of the first electron transport sub-layer and less than an energy level of conduction band minimum of the quantum dot light emitting layer.

For example, in the method for manufacturing the quantum dot light emitting structure provided by an embodiment of the present disclosure, the first electron transport sub-layer includes a ZnO thin film, and the second electron transport sub-layer includes a doped ZnO thin film.

For example, in the method for manufacturing the quantum dot light emitting structure provided by an embodiment of the present disclosure, a doping concentration of the second electron transport sub-layer is gradually increased from a side, close to the first electron transport sub-layer, of the second electron transport sub-layer, to a side, close to the quantum dot light emitting layer, of the second electron transport sub-layer.

For example, in the method for manufacturing the quantum dot light emitting structure provided by an embodiment of the present disclosure, forming the second electron transport sub-layer by the spluttering process includes: forming a plurality of doped electron transport sub-layers, with different doping concentrations, on a side, close to the quantum dot light emitting layer, of the first electron transport sub-layer, and the plurality of doped electron transport sub-layers forming the second electron transport sub-layer, wherein the doping concentrations of the plurality of doped electron transport sub-layers are gradually increased in a direction from the first electron transport sub-layer to the quantum dot light emitting layer.

BRIEF DESCRIPTION OF THE DRAWINGS

In order to more clearly illustrate the technical solution of the embodiments of the present disclosure, the drawings of the embodiments will be briefly described in the following. It is obvious that the described drawings below are only related to some embodiments of the present disclosure without constituting any limitation thereto.

DETAILED DESCRIPTION

Figure 1:
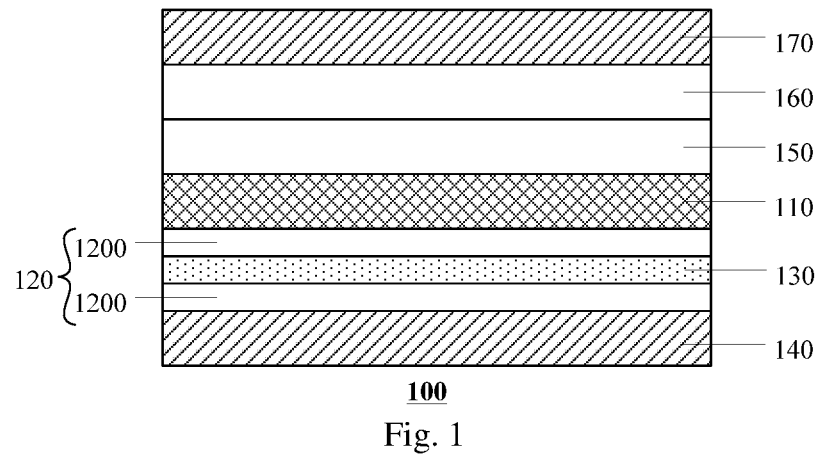
FIG. 1 is a schematic diagram of a quantum dot light emitting structure according to an embodiment of the present disclosure.

In order to make objectives, technical details and advantages of the embodiments of the present disclosure more clearly, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment (s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects.

At present, an active-matrix quantum dot light emitting diode (AMQLED) has received more and more attention due to its potential advantages in wide color gamut, long service life, and the like. With the gradual deepening of research on AMQLED, a quantum efficiency of an AMQLED product has been continuously improved, which basically reaches the level of industrialization. Due to natural characteristics of a quantum dot material, a quantum dot light emitting diode (QLED) is generally manufactured by printing technologies or printing methods, which may effectively improve a utilization rate of the material and may become an effective way to preparation in large area.

When the QLED adopts an inverted structure, and is prepared by an ink-jet printing process, a pixel definition layer may be prepared in advance before each functional film layer of a light emitting element is deposited. However, each functional film layer of the light emitting element has the problem of ink climbing, the ink even climbs to a top platform area of a pixel definition layer, which greatly affects film morphology and thickness uniformity of each functional film layer, thereby greatly affecting device performance and uniformity, and affecting mass production of the QLED. Especially in high-resolution products, the above-mentioned problem is more significant. If the QLED adopts an upright structure, a hole injection layer and a hole transport layer on the top of a quantum dot light emitting layer also have the problem of nonuniformity. Degree of nonuniformity of each functional film layer is accumulated layer by layer, which will further affect the uniformity of the quantum dot light emitting layer and the light emitting element finally formed.

When the QLED adopts the inverted structure, an electron transport layer (for example, a zinc oxide (ZnO) film formed by sputtering) may be formed by a sputtering process, so that the problem of uneven thickness of the film layers during the mass production may be solved. However, when the ZnO electron transport layer is formed by the sputtering process, the formed thin-film ZnO has a high mobility, so that more electrons are injected, and an energy level of conduction band minimum (or a lowest unoccupied molecular orbital (LUMO) energy level) is deeper, and has a great difference with an energy level of conduction band minimum of the quantum dot light emitting layer, resulting in a difficulty in injecting the electrons into the quantum dot light emitting layer from the electron transport layer, to affect a luminous efficiency of the QLED.

Thus, embodiments of the present disclosure provide a quantum dot light emitting structure, a method for manufacturing the same, an array substrate, and a display device. The quantum dot light emitting structure includes a quantum dot light emitting layer, an electrode, and an electron transport layer located between the quantum dot light emitting layer and the electrode, and further includes an electron blocking layer located in the electron transport layer. Thus, by adding the electron blocking layer in the electron transport layer, the electrons injected into the electron transport layer from the electrode may be reduced, a carrier concentration of the quantum dot light emitting layer may be balanced, and the luminous efficiency of the quantum dot light emitting structure may be improved.

Hereinafter, the quantum dot light emitting structure, the method for manufacturing the same, the array substrate, and the display device, provided by the embodiments of the present disclosure, are described below in detail in conjunction with accompanying drawings.

An embodiment of the present disclosure provides a quantum dot light emitting structure. FIG. 1 is a schematic diagram of a quantum dot light emitting structure according to an embodiment of the present disclosure. As illustrated by FIG. 1, the quantum dot light emitting structure 100 includes a quantum dot light emitting layer 110, a first electrode 140, and an electron transport layer 120 located between the quantum dot light emitting layer 110 and the first electrode 140, and further includes an electron blocking layer 130 located in the electron transport layer 120.

In the quantum dot light emitting structure provided by the embodiment of the present disclosure, by adding the electron blocking layer in the electron transport layer, electrons injected into the electron transport layer from the electrode may be reduced when the electron transport layer has a high mobility, so that a carrier concentration of the quantum dot light emitting layer may be balanced, and a luminous efficiency of the quantum dot light emitting structure may be improved. A turn-on voltage may be effectively reduced by arranging the electron blocking layer in the electron transport layer.

In some examples, as illustrated by FIG. 1, the electron transport layer 120 includes two electron transport sub-layers 1200, and the electron blocking layer 130 is located between the two electron transport sub-layers 1200. However, the embodiment of the present disclosure includes, but is not limited to this. The electron blocking layer may be formed, in other ways, in the electron transport layer.

Figure 2:
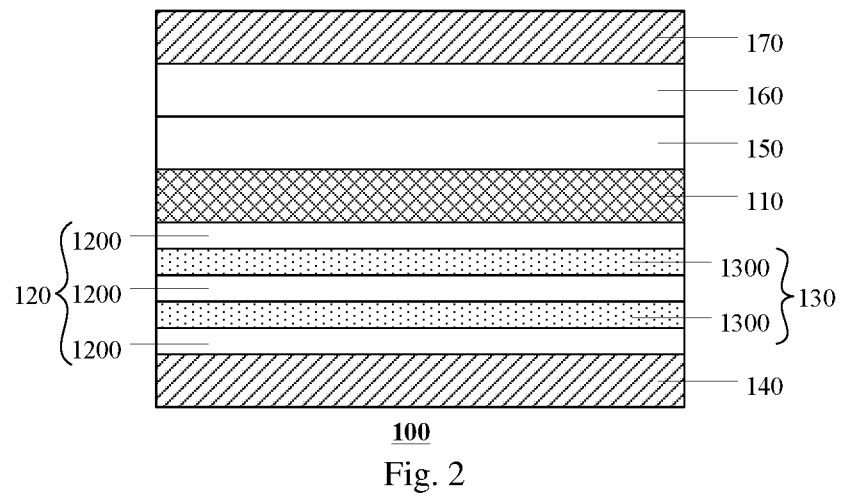
FIG. 2 is a schematic diagram of another quantum dot light emitting structure according to an embodiment of the present disclosure.

FIG. 2 is a schematic diagram of another quantum dot light emitting structure according to an embodiment of the present disclosure. As illustrated by FIG. 2, an electron transport layer 120 includes N+1 electron transport sub-layers 1200, an electron blocking layer 130 includes N electron blocking sub-layers 1300, and the N electron blocking sub-layers 1300 are respectively sandwiched among the N+1 electron transport sub-layers 1200. It should be noted that two electron blocking sub-layers 1300 are shown in FIG. 2, that is N=2. However, the embodiment of the present disclosure includes, but is not limited to this, and N may be a positive integer equal to or greater than 2.

In some examples, the electron blocking layer 130 includes N electron blocking sub-layers 1300 that may be manufactured by different materials. For example, when the electron blocking layer 130 includes two electron blocking sub-layers 1300, one of the two electron blocking sub-layers 1300 may be an electron blocking sub-layer made of an aluminum oxide ($Al_2O_3$) material, and the other one may be an electron blocking sub-layer made of a tantalum oxide ($TaO_x$) material. However, the embodiment of the present disclosure includes, but is not limited to this. The electron blocking layer includes the N electron blocking sub-layers that may be preferably electron blocking layers manufactured by the same material. In such case, complexity of a manufacturing process may be reduced, and control and implementation are facilitated.

In some examples, the electron transport layer 120 mentioned above may include a zinc oxide (ZnO) thin film formed by spluttering. The ZnO thin film, manufactured by a spin-coating method generally contains impurities (which may be organic ligands and the like); the ZnO thin film, formed by a spluttering process, is a thin film in an amorphous or polycrystalline state, so that the ZnO thin film formed by spluttering contains no impurities, and has high compactness and flatness. Thus, the electron transport layer 120 may have high compactness and flatness, thereby facilitating improvement of the flatness of the quantum dot light emitting layer formed later, to improve flatness and luminous performance of the quantum dot light emitting structure finally formed. That is to say, the quantum dot light emitting structure may have high flatness and luminous performance, as well as high luminous efficiency.

For example, when the electron transport layer 120 includes at least two electron transport sub-layers 1200, the electron transport sub-layers 1200 each are a ZnO thin film formed by spluttering.

For example, an LUMO energy level of ordinary ZnO nanoparticles is about −4.2 eV to −4.0 eV, and an LUMO energy level of the ZnO thin film manufactured by the spluttering process is about −4.8 eV to −4.6 eV. Thus, the LUMO energy level of the ZnO thin film manufactured by the spluttering process is deeper, and has a great difference with that of the quantum dot light emitting layer.

In some examples, an energy level of conduction band minimum of the electron blocking layer 130 is greater than that of a quantum dot light emitting layer 110, so that electrons injected into the electron transport layer from the electrode may be reduced when the electron transport layer has a high mobility. The energy level of conduction band minimum of the electron blocking layer is greater than (or shallower than) that of the electron transport layer.

In some examples, a material of the electronic blocking layer 130 includes at least one selected from the group consisting of aluminum oxide, tantalum oxide, and hafnium oxide. However, the embodiment of the present disclosure includes, but is not limited to this. The material of the electron blocking layer may be other materials.

In some examples, as illustrated by FIG. 1 and FIG. 2, the electron transport layer 120 is in direct contact with the quantum dot light emitting layer 110.

In some examples, a thickness, in a direction perpendicular to the quantum dot light emitting layer 110, of the electron blocking layer 130 ranges from 0.5 nm to 5 nm.

For example, the thickness, in the direction perpendicular to the quantum dot light emitting layer 110, of the electron blocking layer 130 may be about 1 nm to 2 nm. In such case, the quantum dot light emitting structure may have a good luminous efficiency. It should be noted that when the electron blocking layer includes a plurality of electron blocking sub-layers, the thickness mentioned above refers to the sum of thicknesses of the plurality of electron blocking sub-layers. It should be noted that the above-mentioned "about 1 nm to 2 nm" indicates that a lower limit of the thickness of the electron blocking layer is within an error range of 10% of 5 nm, and an upper limit of the thickness of the electron blocking layer is within an error range of 10% of 10 nm.

In some examples, a range of a root-mean-square (RMS) roughness of a surface, close to the quantum dot light emitting layer, of the electron transport layer, is about 5 nm to 10 nm. Thus, the roughness of the surface, close to the quantum dot light emitting layer, of the electron transport layer is higher, so that contact between quantum dots in the quantum dot light emitting layer and the electron transport layer is increased, the quantum dots in a state of nanoparticles are prevented from accumulating on the smooth ZnO surface, and electric leakage caused by a small contact area or by direct contact between a part of an inverted electron transport layer and a follow-up hole transport layer is avoided. It should be noted that the above-mentioned "about 5 to 10 nm" indicates that a lower limit of the RMS surface roughness is within an error range of 10% of 5 nm, and an upper limit of the RMS surface roughness is within an error range of 10% of 10 nm.

For example, the surface, close to the quantum dot light emitting layer, of the electron transport layer may be subjected to roughening by means such as plasma etching or sandblasting treatment.

Figure 3:
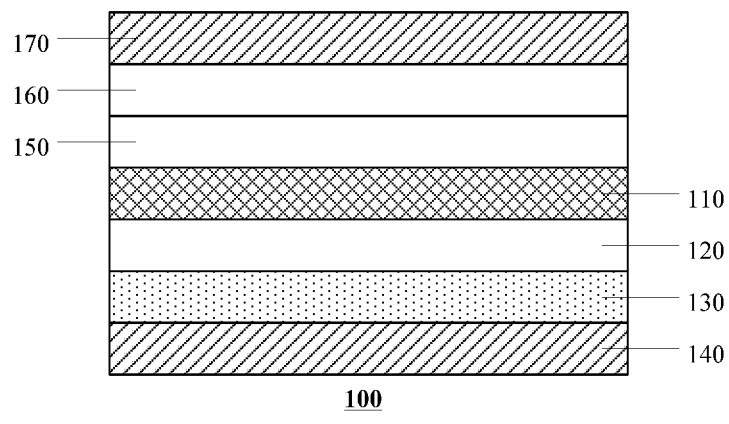
FIG. 3 is a schematic diagram of another quantum dot light emitting structure according to an embodiment of the present disclosure.

FIG. 3 is a schematic diagram of another quantum dot light emitting structure according to an embodiment of the present disclosure. As illustrated by FIG. 3, the quantum dot light emitting structure 100 includes a quantum dot light emitting layer 110, a first electrode 140, and an electron transport layer 120 located between the quantum dot light emitting layer 110 and the first electrode 140, and further includes an electron blocking layer 130 located between the electron transport layer 120 and the first electrode 140. In the quantum dot light emitting structure, by adding the electron blocking layer between the electron transport layer and the electrode, electrons injected into the electron transport layer from the electrode may be reduced when the electron transport layer has a high mobility, so that a carrier concentration of the quantum dot light emitting layer may be balanced, and a luminous efficiency of the quantum dot light emitting structure may be improved.

Figure 4:
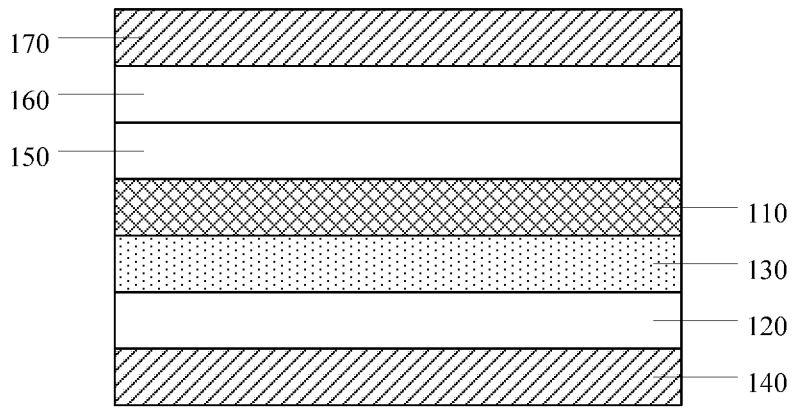
FIG. 4 is a schematic diagram of another quantum dot light emitting structure according to an embodiment of the present disclosure.

FIG. 4 is a schematic diagram of another quantum dot light emitting structure according to an embodiment of the present disclosure. As illustrated by FIG. 4, the quantum dot light emitting structure 100 includes a quantum dot light emitting layer 110, a first electrode 140, and an electron transport layer 120 located between the quantum dot light emitting layer 110 and the first electrode 140, and further includes an electron blocking layer 130 located between the electron transport layer 120 and the quantum dot light emitting layer 110. In the quantum dot light emitting structure, by adding the electron blocking layer between the electron transport layer and the quantum dot light emitting layer, electrons injected into the electron transport layer from the electrode may be reduced to a certain extent, so that a carrier concentration of the quantum dot light emitting layer may be balanced, and a luminous efficiency of the quantum dot light emitting structure may be improved.

Figure 5:
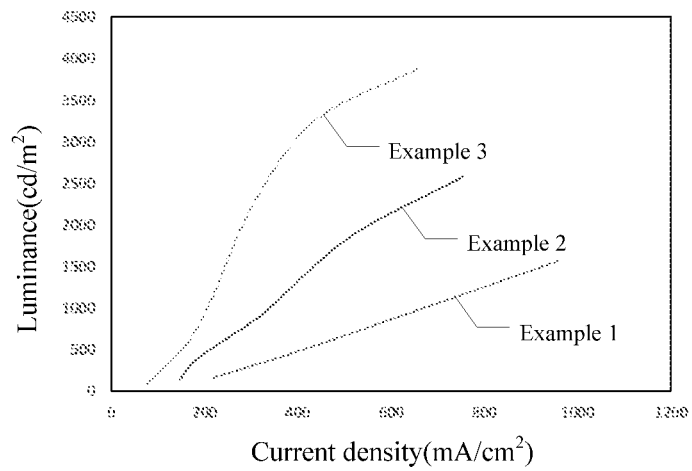
FIG. 5 is a comparison diagram of curves of a luminance, changing along with a current density, of different quantum dot light emitting structures provided by the present disclosure.

FIG. 5 is a comparison diagram of curves of a luminance, changing along with a current density, of different quantum dot light emitting structures provided by the present disclosure.

In FIG. 5, Example 1 provides a quantum dot light emitting structure, which includes a silver (Ag) electrode, a hole injection layer, a hole transport layer, a quantum dot light emitting layer, a ZnO electron transport layer, and an indium tin oxide (ITO) electrode that are sequentially overlapped. A thickness of the Ag electrode is 150 nm, and a thickness of the hole injection layer is 5 nm. A material of the hole injection layer is an HAT-CN (2,3,6,7,10,11-Hexacyano-1,4,5,8,9,12-hexaazatriphenylene) thin film. The hole transport layer includes a first hole transport sub-layer and a second hole transport sub-layer, where the first hole transport sub-layer is located on a side, close to the quantum dot light emitting layer, of the second hole transport sub-layer, a thickness of the first hole transport sub-layer is 10 nm, and a thickness of the second hole transport sub-layer is 30 nm.

The Ag electrode, the hole injection layer, and the hole transport layer all may be manufactured by an evaporation process. A material of the quantum dot light emitting layer may be cadmium selenide (CdSe), a thickness of the quantum dot light emitting layer is 30 nm, and the quantum dot light emitting layer may be manufactured by a spin-coating process. A thickness of the ZnO electron transport layer is 100 nm, the ZnO electron transport layer may be manufactured by a spluttering process, and a ZnO target may be used for spluttering, with an argon flow of 40 sccm, a power of 100 W, and a spluttering duration of 25 minutes. A thickness of the ITO electrode is 70 nm, the ITO electrode may be manufactured by the spluttering process, and an ITO target may be used for spluttering, with an argon flow of 40 sccm, a power of 100 W, and a spluttering duration of 20 minutes.

In FIG. 5, Example 2 provides a quantum dot light emitting structure, which includes an Ag electrode, a hole injection layer, a hole transport layer, a quantum dot light emitting layer, an electron blocking layer, a ZnO electron transport layer, and an ITO electrode that are sequentially overlapped. A thickness of the Ag electrode is 150 nm, and a thickness of the hole injection layer is 5 nm. A material of the hole injection layer is an HAT-CN (2,3,6,7,10,11-Hexacyano-1,4,5,8,9,12-hexaazatriphenylene) thin film. The hole transport layer includes a first hole transport sub-layer and a second hole transport sub-layer, where the first hole transport sub-layer is located on a side, close to the quantum dot light emitting layer, of the second hole transport sub-layer, a thickness of the first hole transport sub-layer is 10 nm, and a thickness of the second hole transport sub-layer is 30 nm. The Ag electrode, the hole injection layer, and the hole transport layer all may be manufactured by an evaporation process. A material of the quantum dot light emitting layer may be CdSe, a thickness of the quantum dot light emitting layer is 30 nm, and the quantum dot light emitting layer may be manufactured by a spin-coating process. A material of the electron blocking layer may be Al2O3, a thickness of the electron blocking layer is 2 nm, the electron blocking layer may be manufactured by a spluttering process, and an Al2O3 target may be used for spluttering, with an argon flow of 40 sccm, a power of 100 W, and a spluttering duration of 1 minute. A thickness of the ZnO electron transport layer is 100 nm, the ZnO electron transport layer may be manufactured by the spluttering process, and a ZnO target may be used for spluttering, with an argon flow of 40 sccm, a power of 100 W, and a spluttering duration of 25 minutes. A thickness of the ITO electrode is 70 nm, the ITO electrode may be manufactured by the spluttering process, and an ITO target may be used for spluttering, with an argon flow of 40 sccm, a power of 100 W, and a spluttering duration of 20 minutes. In Example 2, the Al2O3 electron blocking layer is arranged between the ZnO electron transport layer and the quantum dot light emitting layer, thus, the quantum dot light emitting structure provided in Example 2 is the quantum dot light emitting structure provided in FIG. 4.

In FIG. 5, Example 3 provides a quantum dot light emitting structure, which includes an Ag electrode, a hole injection layer, a hole transport layer, a quantum dot light emitting layer, a ZnO electron transport layer, an electron blocking layer, and an ITO electrode that are sequentially overlapped. A thickness of the Ag electrode is 150 nm, and a thickness of the hole injection layer is 5 nm. A material of the hole injection layer is an HAT-CN (2,3,6,7,10,11-Hexacyano-1,4,5,8,9,12-hexaazatriphenylene) thin film. The hole transport layer includes a first hole transport sub-layer and a second hole transport sub-layer, where the first hole transport sub-layer is arranged on a side, close to the quantum dot light emitting layer, of the second hole transport sub-layer, a thickness of the first hole transport sub-layer is 10 nm, and a thickness of the second hole transport sub-layer is 30 nm. The Ag electrode, the hole injection layer, and the hole transport layer all may be manufactured by an evaporation process. A material of the quantum dot light emitting layer may be CdSe, a thickness of the quantum dot light emitting layer is 30 nm, and the quantum dot light emitting layer may be manufactured by a spin-coating process. A thickness of the ZnO electron transport layer is 100 nm, the ZnO electron transport layer may be manufactured by the spluttering process, and a ZnO target may be used for spluttering, with an argon flow of 40 sccm, a power of 100 W, and a spluttering duration of 25 minutes. A material of the electron blocking layer may be Al2O3, a thickness of the electron blocking layer is 2 nm, the electron blocking layer may be manufactured by a spluttering process, and an Al2O3 target may be used for spluttering, with an argon flow of 40 sccm, a power of 100 W, and a spluttering duration of 1 minute. A thickness of the ITO electrode is 70 nm, the ITO electrode may be manufactured by the spluttering process, and an ITO target may be used for spluttering, with an argon flow of 40 sccm, a power of 100 W, and a spluttering duration of 20 minutes. In Example 3, the Al2O3 electron blocking layer is arranged between the ZnO electron transport layer and the ITO electrode, thus, the quantum dot light emitting structure provided in Example 3 is the quantum dot light emitting structure provided in FIG. 3.

As illustrated by FIG. 5, under the same current density, compared with the quantum dot light emitting structure provided in Example 1, by adding the electron blocking layer between the electron transport layer and the quantum dot light emitting layer, the luminance of the quantum dot light emitting structure provided in Example 2 is increased to a certain extent. For example, when the current density is 400 mA/cm2, the luminance of the quantum dot light emitting structure provided in Example 1 is about 500 cd/m2, and the luminance of the quantum dot light emitting structure provided in Example 2 is about 1200 cd/m2. However, because direct contact between the quantum dot light emitting layer and the electron blocking layer will cause a decrease of a photoluminescence quantum yield (PLQY), improvement of the luminance of the quantum dot light emitting structure provided in Example 2 is not very high. Compared with the quantum dot light emitting structure provided in Example 1, by adding the electron blocking layer between the electron transport layer and the electrode, the luminance of the quantum dot light emitting structure provided in Example 3 is greatly increased. For example, when the current density is 400 mA/cm2, the luminance of the quantum dot light emitting structure provided in Example 3 is about 3000 cd/m2, and the luminance is increased by nearly 6 times. It should be noted that the above-mentioned quantum dot light emitting structures each further include other necessary functional film layers, which will not be described in detail in the embodiment of the present disclosure.

For example, as illustrated by FIG. 5, under the current density of 400 mA/cm2, the luminance of the quantum dot light emitting structure provided in Example 3 is greater than 3000 cd/m2.

Figure 6:
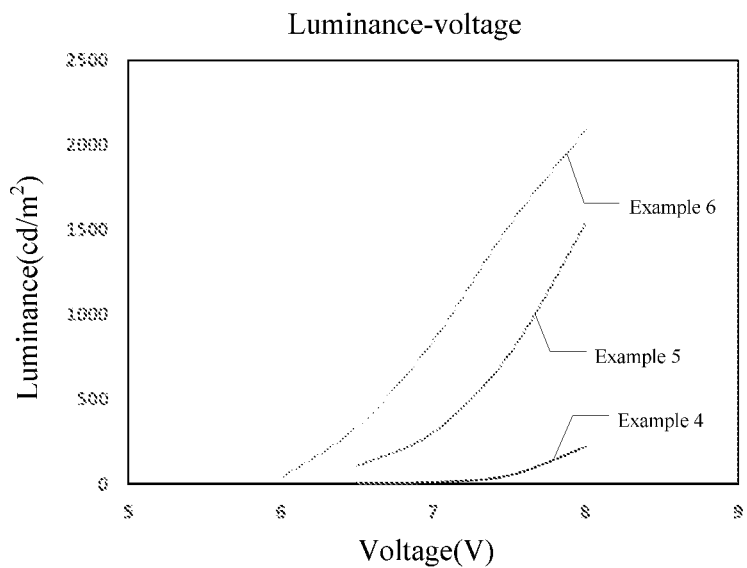
FIG. 6 is a comparison diagram of curves of a luminance, changing along with a voltage, of different quantum dot light emitting structures provided by the present disclosure.

FIG. 6 is a comparison diagram of curves of a luminance, changing along with a voltage, of different quantum dot light emitting structures provided by the present disclosure.

In FIG. 6, Example 4 provides a quantum dot light emitting structure, which includes an Ag electrode, a hole injection layer, a hole transport layer, a quantum dot light emitting layer, a ZnO electron transport layer, an electron blocking layer, and an ITO electrode that are sequentially arranged. A thickness of the Ag electrode is 150 nm, and a thickness of the hole injection layer is 5 nm. A material of the hole injection layer is an HAT-CN (2,3,6,7,10,11-Hexacyano-1,4,5,8,9,12-hexaazatriphenylene) thin film. The hole transport layer includes a first hole transport sub-layer and a second hole transport sub-layer, where the first hole transport sub-layer is arranged on a side, close to the quantum dot light emitting layer, of the second hole transport sub-layer, a thickness of the first hole transport sub-layer is 10 nm, and a thickness of the second hole transport sub-layer is 30 nm. The Ag electrode, the hole injection layer, and the hole transport layer all may be manufactured by an evaporation process. A material of the quantum dot light emitting layer may be CdSe, a thickness of the quantum dot light emitting layer is 30 nm, and the quantum dot light emitting layer may be manufactured by a spin-coating process. A thickness of the ZnO electron transport layer is 100 nm, the ZnO electron transport layer may be manufactured by the spluttering process, and a ZnO target may be used for spluttering, with an argon flow of 40 sccm, a power of 100 W, and a spluttering duration of 25 minutes. A material of the electron blocking layer may be Al2O3, a thickness of the electron blocking layer is 2 nm, the electron blocking layer may be manufactured by a spluttering process, and an Al2O3 target may be used for spluttering, with an argon flow of 40 sccm, a power of 100 W, and a spluttering duration of 1 minute. A thickness of the ITO electrode is 70 nm, the ITO electrode may be manufactured by the spluttering process, and an ITO target may be used for spluttering, with an argon flow of 40 sccm, a power of 100 W, and a spluttering duration of 20 minutes. In Example 4, the Al2O3 electron blocking layer is arranged between the ZnO electron transport layer and the ITO electrode, thus, the quantum dot light emitting structure provided in Example 4 is the quantum dot light emitting structure provided in FIG. 3.

In FIG. 6, Example 5 provides a quantum dot light emitting structure, which includes an Ag electrode, a hole injection layer, a hole transport layer, a quantum dot light emitting layer, a first ZnO electron transport sub-layer, an electron blocking layer, a second ZnO electron transport sub-layer, and an ITO electrode that are sequentially arranged. A thickness of the Ag electrode is 150 nm, and a thickness of the hole injection layer is 5 nm. A material of the hole injection layer is an HAT-CN (2,3,6,7,10,11-Hexacyano-1,4,5,8,9,12-hexaazatriphenylene) thin film. The hole transport layer includes a first hole transport sub-layer and a second hole transport sub-layer, where the first hole transport sub-layer is arranged on a side, close to the quantum dot light emitting layer, of the second hole transport sub-layer, a thickness of the first hole transport sub-layer is 10 nm, and a thickness of the second hole transport sub-layer is 30 nm. The Ag electrode, the hole injection layer, and the hole transport layer all may be manufactured by an evaporation process. A material of the quantum dot light emitting layer may be CdSe, a thickness of the quantum dot light emitting layer is 30 nm, and the quantum dot light emitting layer may be manufactured by a spin-coating process. A thickness of the first ZnO electron transport sub-layer is 50 nm, a thickness of the second ZnO electron transport sub-layer is 50 nm, both the first ZnO electron transport sub-layer and the second ZnO transport sub-layer may be manufactured by a spluttering process, and a ZnO target may be used for spluttering, with an argon flow of 40 sccm, a power of 100 W, and a spluttering duration of 12.5 minutes. A material of the electron blocking layer may be Al2O3, a thickness of the electron blocking layer is 2 nm, the electron blocking layer may be manufactured by the spluttering process, and an Al2O3 target may be used for spluttering, with an argon flow of 40 sccm, a power of 100 W, and a spluttering duration of 1 minute. A thickness of the ITO electrode is 70 nm, the ITO electrode may be manufactured by the spluttering process, and an ITO target may be used for spluttering, with an argon flow of 40 sccm, a power of 100 W, and a spluttering duration of 20 minutes. In Example 5, the Al2O3 electron blocking layer is arranged between the two ZnO electron transport sub-layers, thus, the quantum dot light emitting structure provided in Example 5 is the quantum dot light emitting structure provided in FIG. 1.

In FIG. 6, Example 6 provides a quantum dot light emitting structure, which includes an Ag electrode, a hole injection layer, a hole transport layer, a quantum dot light emitting layer, a first ZnO electron transport sub-layer, a first electron blocking sub-layer, a second ZnO electron transport sub-layer, a second electron blocking sub-layer, a third ZnO electron transport sub-layer, and an ITO electrode that are sequentially arranged. A thickness of the Ag electrode is 150 nm, and a thickness of the hole injection layer is 5 nm. A material of the hole injection layer is an HAT-CN (2,3,6,7, 10,11-Hexacyano-1,4,5,8,9,12-hexaazatriphenylene) thin film. The hole transport layer includes a first hole transport sub-layer and a second hole transport sub-layer, where the first hole transport sub-layer is arranged on a side, close to the quantum dot light emitting layer, of the second hole transport sub-layer, a thickness of the first hole transport sub-layer is 10 nm, and a thickness of the second hole transport sub-layer is 30 nm. The Ag electrode, the hole injection layer, and the hole transport layer all may be manufactured by an evaporation process. A material of the quantum dot light emitting layer may be CdSe, a thickness of the quantum dot light emitting layer is 30 nm, and the quantum dot light emitting layer may be manufactured by a spin-coating process. A thickness of the first ZnO electron transport sub-layer is 50 nm, a thickness of the second ZnO electron transport sub-layer is 50 nm, a thickness of the third ZnO electron transport sub-layer is 50 nm, both the first ZnO electron transport sub-layer and the second ZnO transport sub-layer may be manufactured by a spluttering process, and a ZnO target may be used for spluttering, with an argon flow of 40 sccm, a power of 100 W, and a spluttering duration of 12.5 minutes. Materials of the first electron blocking sub-layer and the second electron blocking sub-layer may be Al2O3, a thickness of the first electron blocking sub-layer is 1 nm, a thickness of the second electron blocking sub-layer is 1 nm, both the first electron blocking sub-layer and the second electron blocking sub-layer may be manufactured by the spluttering process, and an Al2O3 target may be used for spluttering, with an argon flow of 40 sccm, a power of 100 W, and a spluttering duration of 0.5 minute. A thickness of the ITO electrode is 70 nm, the ITO electrode may be manufactured by the spluttering process, and an ITO target may be used for spluttering, with an argon flow of 40 sccm, a power of 100 W, and a spluttering duration of 20 minutes. In Example 6, the two Al2O3 electron blocking sub-layers are arranged among the three ZnO electron transport sub-layers, thus, the quantum dot light emitting structure provided in Example 6 is the quantum dot light emitting structure provided in FIG. 2.

As illustrated by FIG. 6, under the same voltage, compared with the quantum dot light emitting structure provided in Example 4, by adding the electron blocking layer in the electron transport layer, the quantum dot light emitting structures provided in Example 5 and Example 6 each have a higher luminance under the same voltage, and further have a lower turn-on voltage. As illustrated by FIG. 6, compared with the quantum dot light emitting structure provided in Example 5, by dividing the single electron blocking layer into a plurality of electron blocking sub-layers that are thinner and arranging the electron blocking sub-layers among a plurality of electron transport sub-layers, the turn-on voltage may be further reduced.

For example, the luminance of the quantum dot light emitting structure provided in Example 4 is greater than 200 cd/m2 under a voltage about 8 V, the luminance of the quantum dot light emitting structure in Example 5 may be greater than 200 cd/m2 under a voltage about 6.5 V, and the luminance of the quantum dot light emitting structure in Example 6 may be greater than 200 cd/m2 under a voltage about 6.2 V. For another example, as illustrated by FIG. 6, the luminance of the quantum dot light emitting structure provided in Example 6 is greater than 500 cd/m2 under a voltage of 7 V.

Figure 7:
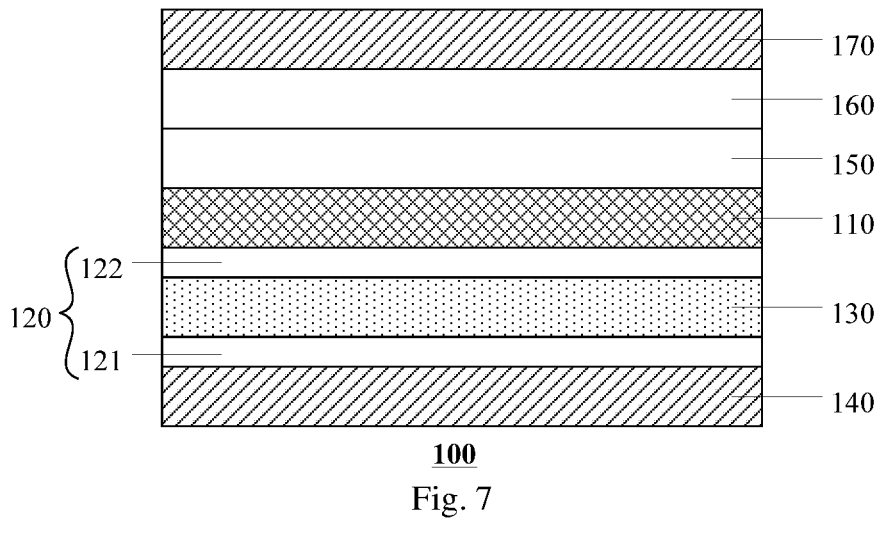
FIG. 7 is a schematic diagram of another quantum dot light emitting structure according to an embodiment of the present disclosure.

FIG. 7 is a schematic diagram of another quantum dot light emitting structure according to an embodiment of the present disclosure. As illustrated by FIG. 7, an electron transport layer 120 may include a first electron transport sub-layer 121 and a second electron transport sub-layer 122, and the second electron transport sub-layer 122 is located on a side, close to a quantum dot light emitting layer 110, of the first electron transport sub-layer 121. An energy level of conduction band minimum of the second electron transport sub-layer 122 is greater than that of the first electron transport sub-layer 121 and less than that of the quantum dot light emitting layer 110. That is to say, the energy level of conduction band minimum of the second electron transport sub-layer 122 is shallower than that of the first electron transport sub-layer 121, and is deeper than that of the quantum dot light emitting layer 110. In addition, as illustrated by FIG. 7, the quantum dot light emitting structure 100 further includes an electron blocking layer 130 located between the first electron transport sub-layer 121 and the second electron transport sub-layer 122. It should be noted that the energy level of conduction band minimum is an LUMO energy level. In the quantum dot light emitting structure provided in the example, because the energy level of conduction band minimum of the second electron transport sub-layer is greater than that of the first electron transport sub-layer and less than that of the quantum dot light emitting layer, the LUMO energy level of the second electron transport sub-layer is closer to that of the quantum dot light emitting layer, energy level matching may be better achieved, and improvement of a luminous efficiency of the quantum dot light emitting structure may be facilitated. In addition, the quantum dot light emitting structure further includes the electron blocking layer located between the first electron transport sub-layer and the second electron transport sub-layer. The quantum dot light emitting structure has good energy level matching and high luminous efficiency. Besides, by adding the electron blocking layer between the first electron transport sub-layer and the second electron transport sub-layer, electrons injected into the electron transport layer from the electrode may be reduced when the electron transport layer has a high mobility, so that a carrier concentration of the quantum dot light emitting layer may be balanced, and the luminous efficiency of the quantum dot light emitting structure may be improved.

For example, the first electron transport sub-layer 121 is a ZnO thin film formed by spluttering, and the second electron transport sub-layer 122 is a doped ZnO thin film formed by spluttering. Because the second electron transport sub-layer 122 is formed as the doped ZnO thin film, the energy level of conduction band minimum of the second electron transport sub-layer 122 is greater than that of the first electron transport sub-layer 121 and less than that of the quantum dot light emitting layer 110. In addition, the ZnO thin film, formed by a spluttering process, is a thin film in an amorphous or polycrystalline state, so that the ZnO thin film or the doped ZnO thin film formed by spluttering has high compactness and flatness.

For example, a doping material of the second electron transport sub-layer 122 may include at least one selected from the group consisting of Mg (magnesium), Al (aluminum), Zr (zirconium), Hf (hafnium), and Y (yttrium).

For example, the doping material of the second electron transport sub-layer 122 is Mg, and mole percent of Mg in the second electron transport sub-layer 122 ranges from 1% to 20%.

For example, when the quantum dot light emitting layer is a red quantum dot light emitting layer, a doping concentration of Mg in the second electron transport sub-layer may be 1% to 5%; when the quantum dot light emitting layer is a green quantum dot light emitting layer, a doping concentration of Mg in the second electron transport sub-layer may be 5% to 10%; and when the quantum dot light emitting layer is a blue quantum dot light emitting layer, a doping concentration of Mg in the second electron transport sub-layer may be 10% to 20%.

In some examples, a doping concentration of a portion, close to the first electron transport sub-layer 121, of the second electron transport sub-layer 122 is less than a doping concentration of a portion, close to the quantum dot light emitting layer 110, of the second electron transport sub-layer 122. That is to say, the doping concentration of the second electron transport sub-layer may gradually change. With an increase of the doping concentration, the LUMO energy level of the doped ZnO thin film may be increased. Because the doping concentration of the portion, close to the first electron transport sub-layer, of the second electron transport sub-layer is set to be less than the doping concentration of the portion, close to the quantum dot light emitting layer 110, of the second electron transport sub-layer, energy level matching may be better achieved, and improvement of the luminous efficiency of the quantum dot light emitting structure may be facilitated.

In some examples, the doping concentration of the second electron transport sub-layer 122 is gradually increased, from a side, close to the first electron transport sub-layer 121, of the second electron transport sub-layer 122 to a side, close to the quantum dot light emitting layer 110, of the second electron transport sub-layer 122.

In some examples, both the first electron transport sub-layer 121 and the second electron transport sub-layer 122 may be doped ZnO thin films formed by spluttering, and the doping concentration of the first electron transport sub-layer 121 is less than the doping concentration of the second electron transport sub-layer 122. Because the doping concentration of first electron transport sub-layer 121 is less than that of the second electron transport sub-layer 122, the energy level of conduction band minimum of the second electron transport sub-layer 122 is greater than that of the first electron transport sub-layer 121 and less than that of the quantum dot light emitting layer 110.

In some examples, when both the first electron transport sub-layer 121 and the second electron transport sub-layer 122 are doped ZnO thin films formed by spluttering, the first electron transport sub-layer 121 and the second electron transport sub-layer 122 may adopt different doping materials, so that the energy level of conduction band minimum of the second electron transport sub-layer 122 is greater than that of the first electron transport sub-layer 121 and less than that of the quantum dot light emitting layer 110.

In some examples, as illustrated by FIG. 7, the quantum dot light emitting structure 100 may further include a hole transport layer 150, a hole injection layer 160, and a second electrode 170. The first electrode 140 may be a cathode, and the second electrode 170 may be an anode.

Figure 8:
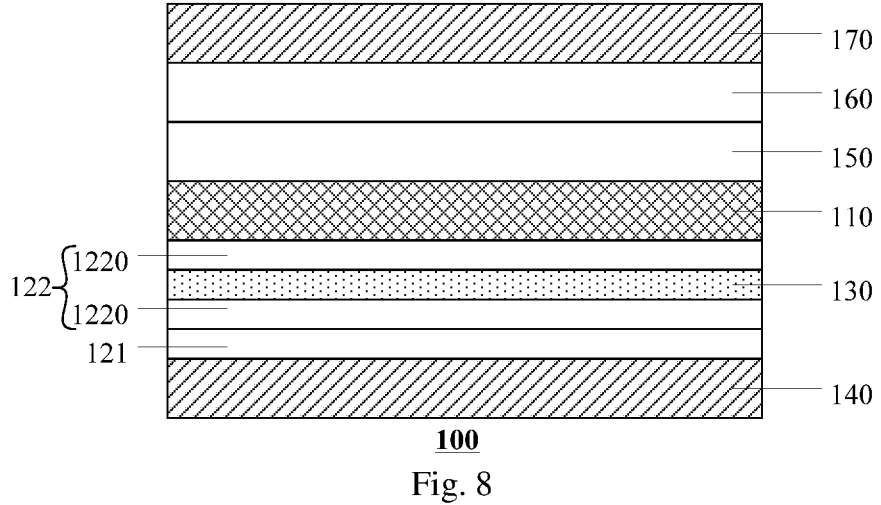
FIG. 8 is a schematic diagram of another quantum dot light emitting structure according to an embodiment of the present disclosure.

FIG. 8 is a schematic diagram of another quantum dot light emitting structure according to an embodiment of the present disclosure. As illustrated by FIG. 8, an electron transport layer 120 may include a first electron transport sub-layer 121 and a second electron transport sub-layer 122, where the second electron transport sub-layer 122 is located on a side, close to a quantum dot light emitting layer 110, of the first electron transport sub-layer 121, and an energy level of conduction band minimum of the second electron transport sub-layer 122 is greater than that of the first electron transport sub-layer 121 and less than that of the quantum dot light emitting layer 110. The second electron transport sub-layer 122 includes a plurality of doped electron transport sub-layers 1220, doping concentrations of the plurality of doped electron transport sub-layers 1220 each are gradually increased in a direction from the first electron transport sub-layer 121 to the quantum dot light emitting layer 110. For example, the second electron transport sub-layer 122 includes two doped electron transport sub-layers 1220, and the doping concentration of the doped electron transport sub-layer 1220 that is close to the first electron transport sub-layer 121 is less than the doping concentration of the doped electron transport sub-layer 1220 that is close to the quantum dot light emitting layer 110.

In the quantum dot light emitting structure provided in the example, the doping concentrations of the plurality of doped electron transport sub-layers each are gradually increased in a direction from the first electron transport sub-layer to the quantum dot light emitting layer; with an increase of the doping concentration, an LUMO energy level of each doped electron transport sub-layer may be increased. By gradually increasing the doping concentrations of the plurality of doped electron transport sub-layers in the direction from the first electron transport sub-layer to the quantum dot light emitting layer, energy level matching may be better achieved, and improvement of a luminous efficiency of the quantum dot light emitting structure may be facilitated.

In the quantum dot light emitting structure provided in the embodiment of the present disclosure, the electron blocking layer is not limited between the first electron transport sub-layer and the second electron transport sub-layer in terms of position, and the electron blocking layer may also be arranged in the second electron transport sub-layer. As illustrated by FIG. 8, an electron blocking layer 130 is arranged in the second electron transport sub-layer 122, for example, the electron blocking layer 130 is arranged between the two doped electron transport sub-layers 1220. Thus, by arranging the electron blocking layer in the second electron transport sub-layer, the luminous efficiency and current efficiency of the quantum dot light emitting structure may be increased, while a turn-on voltage of the quantum dot light emitting structure may be reduced.

In some examples, both the first electron transport sub-layer 121 and the second electron transport sub-layer 122 may be doped ZnO thin films formed by spluttering, and the doping concentration of the first electron transport sub-layer 121 is less than the doping concentration of the second electron transport sub-layer 122. Because the doping concentration of first electron transport sub-layer 121 is less than that of the second electron transport sub-layer 122, the energy level of conduction band minimum of the second electron transport sub-layer 122 is greater than that of the first electron transport sub-layer 121 and less than that of the quantum dot light emitting layer 110.

In some examples, when both the first electron transport sub-layer 121 and the second electron transport sub-layer 122 are doped ZnO thin films formed by spluttering, the first electron transport sub-layer 121 and the second electron transport sub-layer 122 may adopt different doping materials, so that the energy level of conduction band minimum of the second electron transport sub-layer 122 is greater than that of the first electron transport sub-layer 121 and less than that of the quantum dot light emitting layer 110.

Figure 9:
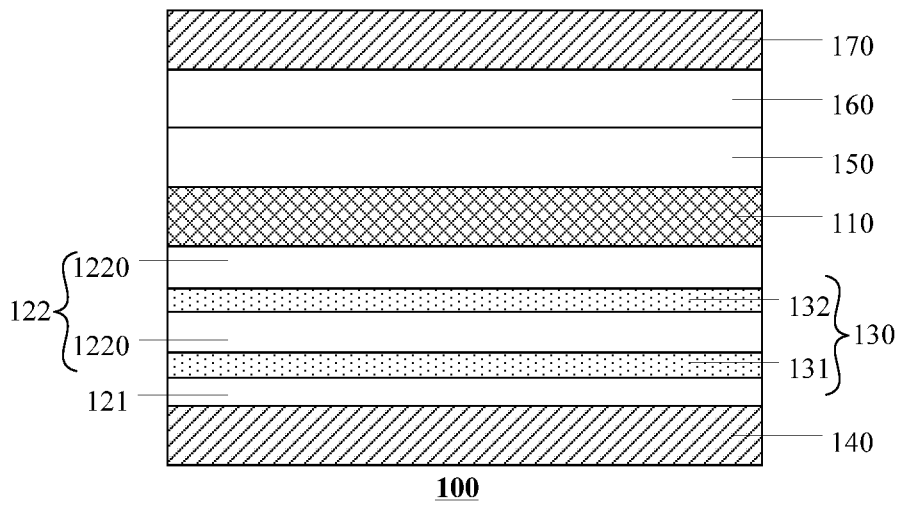
FIG. 9 is a schematic diagram of another quantum dot light emitting structure according to an embodiment of the present disclosure.

FIG. 9 is a schematic diagram of another quantum dot light emitting structure according to an embodiment of the present disclosure. As illustrated by FIG. 9, an electron blocking layer 130 may include a first electron blocking sub-layer 131 and a second electron blocking sub-layer 132, where the first electron blocking sub-layer 131 is located between the first electron transport sub-layer 121 and the second electron transport sub-layer 122, and the second electron blocking sub-layer 132 is located between two doped electron transport sub-layers 1220 in the second electron transport sub-layer 122. Thus, the quantum dot light emitting structure has good energy level matching and high luminous efficiency. Meanwhile, by adding the electron blocking layer between the first electron transport sub-layer and the second electron transport sub-layer, as well as between the doped electron transport sub-layers in the second electron transport sub-layer, electrons injected into the electron transport layer from the electrode may be effectively reduced when the electron transport layer has a high mobility, so that a carrier concentration of the quantum dot light emitting layer may be balanced, and the luminous efficiency of the quantum dot light emitting structure may be improved.

For example, the electron blocking layer 131 and the second electron blocking sub-layer 132 may be electron blocking layers manufactured by different materials. For example, the first electron blocking sub-layers 131 may be an electron blocking sub-layer made of an Al2O3 material, and the second electron blocking sub-layer 132 may be an electron blocking sub-layer made of a TaOx material. However, the embodiment of the present disclosure includes, but is not limited to this. The first electron blocking sub-layer and the second electron blocking sub-layers may be electron blocking layers manufactured by the same material. In such case, complexity of a manufacturing process may be reduced, and control and implementation are facilitated.

It should be noted that when the second electron transport sub-layer includes M (M is an integer greater than 2) doped electron transport sub-layers, the electron blocking layer may also include M electron blocking sub-layers; one of the M electron blocking sub-layers may be arranged between the first electron transport sub-layer and the second electron transport sub-layer, while other M−1 electron blocking sub-layers may be sandwiched among the M electron blocking sub-layers; thus, the electrons injected into the electron transport layer from the electrode may be effectively reduced, the carrier concentration of the quantum dot light emitting layer may be balanced, and the luminous efficiency of the quantum dot light emitting structure may be improved.

Figure 10:
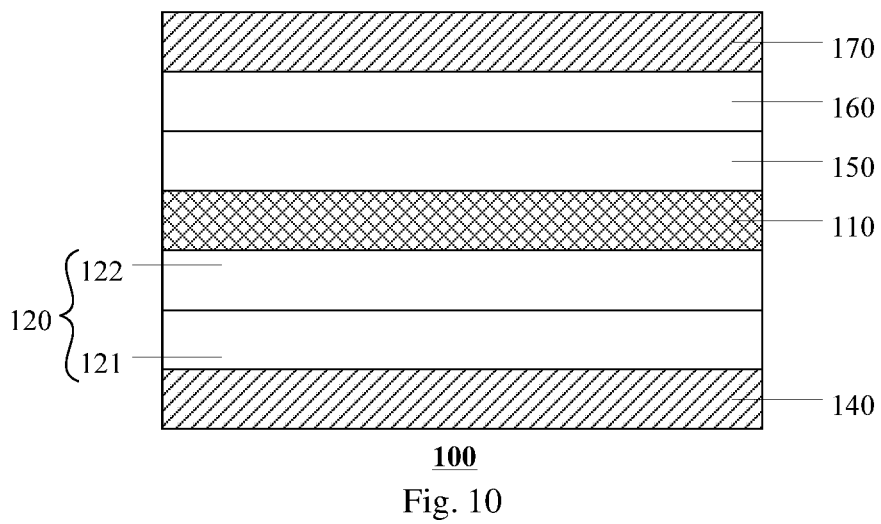
FIG. 10 is a schematic diagram of another quantum dot light emitting structure according to an embodiment of the present disclosure.

FIG. 10 is a schematic diagram of another quantum dot light emitting structure according to an embodiment of the present disclosure. As illustrated by FIG. 10, the quantum dot light emitting structure 100 includes a quantum dot light emitting layer 110, a first electrode 140, and an electron transport layer 120 located between the quantum dot light emitting layer 110 and the first electrode 140. The electron transport layer 120 may include a first electron transport sub-layer 121 and a second electron transport sub-layer 122, and the second electron transport sub-layer 122 is arranged on a side, close to the quantum dot light emitting layer 110, of the first electron transport sub-layer 121. An energy level of conduction band minimum of the second electron transport sub-layer 122 is greater than that of the first electron transport sub-layer 121 and less than that of the quantum dot light emitting layer 110. That is to say, the energy level of conduction band minimum of the second electron transport sub-layer 122 is shallower than that of the first electron transport sub-layer 121, and is deeper than that of the quantum dot light emitting layer 110. It should be noted that the energy level of conduction band minimum is an LUMO energy level.

Figure 11:
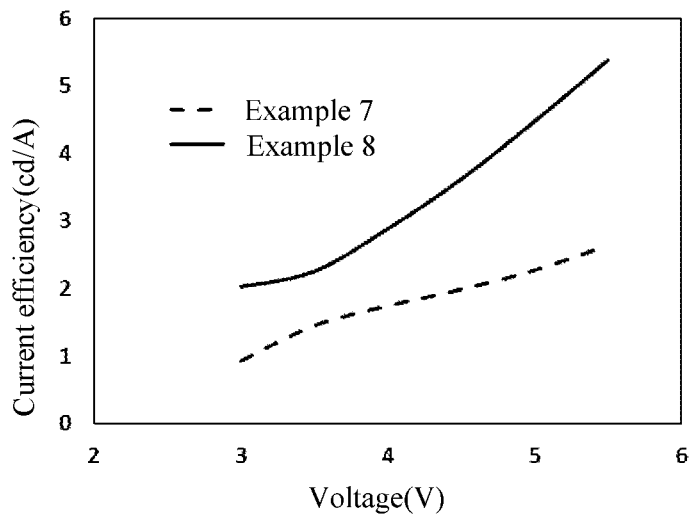
FIG. 11 is a comparison diagram of curves of a current efficiency, changing along with a voltage, of different quantum dot light emitting structures provided by the present disclosure.

FIG. 11 is a comparison diagram of curves of a current efficiency, changing along with a voltage, of different quantum dot light emitting structures provided by the present disclosure.

In FIG. 11, Example 7 provides a quantum dot light emitting structure, which includes an Ag electrode, a hole injection layer, a hole transport layer, a quantum dot light emitting layer, a ZnO electron transport layer, and an ITO electrode that are sequentially arranged. A thickness of the Ag electrode is 150 nm, and a thickness of the hole injection layer is 5 nm. A material of the hole injection layer is an HAT-CN (2,3,6,7,10,11-Hexacyano-1,4,5,8,9,12-hexaazatriphenylene) thin film. The hole transport layer includes a first hole transport sub-layer and a second hole transport sub-layer, where the first hole transport sub-layer is arranged on a side, close to the quantum dot light emitting layer, of the second hole transport sub-layer, a thickness of the first hole transport sub-layer is 10 nm, and a thickness of the second hole transport sub-layer is 30 nm. The Ag electrode, the hole injection layer, and the hole transport layer all may be manufactured by an evaporation process. A material of the quantum dot light emitting layer may be CdSe, a thickness of the quantum dot light emitting layer is 30 nm, and the quantum dot light emitting layer may be manufactured by a spin-coating process. A thickness of the ZnO electron transport layer is 100 nm, the ZnO electron transport layer may be manufactured by a spluttering process, a ZnO target may be used for spluttering, with an argon flow of 40 sccm, a power of 100 W, and a spluttering duration of 25 minutes, and an LUMO energy level of the ZnO electron transport layer manufactured is −4.8 eV. A thickness of the ITO electrode is 70 nm, the ITO electrode may be manufactured by the spluttering process, and an ITO target may be used for spluttering, with an argon flow of 40 sccm, a power of 100 W, and a spluttering duration of 20 minutes.

In FIG. 11, Example 8 provides a quantum dot light emitting structure, which includes an Ag electrode, a hole injection layer, a hole transport layer, a quantum dot light emitting layer, a second ZnO electron transport sub-layer, a first ZnO electron transport sub-layer, and an ITO electrode that are sequentially arranged. A thickness of the Ag electrode is 150 nm, and a thickness of the hole injection layer is 5 nm. A material of the hole injection layer is an HAT-CN (2,3,6,7,10,11-Hexacyano-1,4,5,8,9,12-hexaazatriphenylene) thin film. The hole transport layer includes a first hole transport sub-layer and a second hole transport sub-layer, where the first hole transport sub-layer is arranged on a side, close to the quantum dot light emitting layer, of the second hole transport sub-layer, a thickness of the first hole transport sub-layer is 10 nm, and a thickness of the second hole transport sub-layer is 30 nm. The Ag electrode, the hole injection layer, and the hole transport layer all may be manufactured by an evaporation process. A material of the quantum dot light emitting layer may be CdSe, a thickness of the quantum dot light emitting layer is 30 nm, and the quantum dot light emitting layer may be manufactured by a spin-coating process. A thickness of the second ZnO electron transport sub-layer is 20 nm, the second ZnO electron transport sub-layer may be manufactured by a spluttering process, ZnO and MgO targets may be used for co-spluttering, with an argon flow of 40 sccm, a power of 100 W, and a spluttering duration of 5 minutes, and the LUMO energy level of the second ZnO electron transport sub-layer is −4.6 eV as tested. A thickness of the second ZnO electron transport sub-layer is 80 nm, the second ZnO electron transport sub-layer may be manufactured by the spluttering process, a ZnO target may be used for spluttering, with an argon flow of 40 sccm, a power of 100 W, and a sputtering duration of 20 minutes, and the LUMO energy level of the ZnO electron transport sub-layer manufactured is −4.8 eV. A thickness of the ITO electrode is 70 nm, the ITO electrode may be manufactured by the spluttering process, and an ITO target may be used for spluttering, with an argon flow of 40 sccm, a power of 100 W, and a spluttering duration of 20 minutes.

As illustrated by FIG. 11, in the quantum dot light emitting structure provided in Example 8, the LUMO energy level of the second ZnO electron transport sub-layer formed by a spluttering method is greater than the LUMO energy level of the first ZnO electron transport sub-layer. It can be seen from FIG. 11 that compared with the quantum dot light emitting structure provided in Example 7, because the electron transport layer is configured to include a first electron transport sub-layer and the second electron transport sub-layer, and the energy level of conduction band minimum of the second electron transport sub-layer is greater than that of the first electron transport sub-layer and less than that of the quantum dot light emitting layer, the current efficiency of the quantum dot light emitting structure provided in Example 8 is higher under the same voltage.

For example, as illustrated by FIG. 11, when the voltage is 3 V, the current efficiency of the quantum dot light emitting structure provided in Example 7 is about 1 cd/A, and the current efficiency of the quantum dot light emitting structure provided in Example 8 is about 2 cd/A. When the voltage is 5 V, the current efficiency of the quantum dot light emitting structure provided in Example 7 is about 2 cd/A, and the current efficiency of the quantum dot light emitting structure provided in Example 8 is about 4 cd/A. Thus, the current efficiency of the quantum dot light emitting structure provided in Example 8 is twice of the current efficiency of the quantum dot light emitting structure provided in Example 7.

In some examples, as illustrated by FIG. 11, the electron blocking layer 130 is arranged between the first electron transport sub-layer 121 and the second electron transport sub-layer 122. Thus, the quantum dot light emitting structure may have high luminous efficiency and current efficiency, and may further have low turn-on voltage. It should be noted that the LUMO energy level of the electron blocking layer is greater than those of the first electron transport sub-layer and the second electron transport sub-layer, so that electrons injected into the electron transport layer from the electrode may be reduced when the electron transport layer has a high mobility, and a carrier concentration of the quantum dot light emitting layer may be balanced.

For example, the first electron transport sub-layer 121 is a ZnO thin film formed by spluttering, and the second electron transport sub-layer 122 is a doped ZnO thin film formed by spluttering. In addition, the ZnO thin film, formed by the spluttering process, is a thin film in an amorphous or polycrystalline state, so that the ZnO thin film or the doped ZnO thin film, formed by spluttering, has high compactness and flatness. For example, a doping material of the second electron transport sub-layer 122 may include at least one selected from the group consisting of Mg, Al, Zr, Hf, and Y.

For example, the doping material of the second electron transport sub-layer 122 is Mg, and mole percent of Mg in the second electron transport sub-layer 122 ranges from 1% to 20%.

For example, when the quantum dot light emitting layer is a red quantum dot light emitting layer, a doping concentration of Mg in the second electron transport sub-layer may be 1% to 5%; when the quantum dot light emitting layer is a green quantum dot light emitting layer, a doping concentration of Mg in the second electron transport sub-layer may be 5% to 10%; and when the quantum dot light emitting layer is a blue quantum dot light emitting layer, a doping concentration of Mg in the second electron transport sub-layer may be 10% to 20%.

In some examples, a doping concentration of a portion, close to the first electron transport sub-layer 121, of the second electron transport sub-layer 122 is less than a doping concentration of a portion, close to the quantum dot light emitting layer 110, of the second electron transport sub-layer 122. That is to say, the doping concentration of the second electron transport sub-layer may gradually change. With an increase of the doping concentration, the LUMO energy level of the doped ZnO thin film may be increased. Because the doping concentration of the portion, close to the first electron transport sub-layer, of the second electron transport sub-layer is set to be less than the doping concentration of the portion, close to the quantum dot light emitting layer 110, of the second electron transport sub-layer, energy level matching may be better achieved, and improvement of the luminous efficiency of the quantum dot light emitting structure may be facilitated.

In some examples, the doping concentration of the second electron transport sub-layer 122 is gradually increased, from a side, close to the first electron transport sub-layer 121, of the second electron transport sub-layer 122 to a side, close to the quantum dot light emitting layer 110, of the second electron transport sub-layer 122.

In the quantum dot light emitting structure provided in the example, because the energy level of conduction band minimum of the second electron transport sub-layer is greater than that of the first electron transport sub-layer and less than that of the quantum dot light emitting layer, the LUMO energy level of the second electron transport sub-layer is closer to that of the quantum dot light emitting layer, the energy level matching may be better achieved, and the improvement of the luminous efficiency of the quantum dot light emitting structure may be facilitated.

In some examples, both the first electron transport sub-layer 121 and the second electron transport sub-layer 122 may be doped ZnO thin films formed by spluttering, and the doping concentration of the first electron transport sub-layer 121 is less than the doping concentration of the second electron transport sub-layer 122. Because the doping concentration of first electron transport sub-layer 121 is less than that of the second electron transport sub-layer 122, the energy level of conduction band minimum of the second electron transport sub-layer 122 is greater than that of the first electron transport sub-layer 121 and less than that of the quantum dot light emitting layer 110.

In some examples, when both the first electron transport sub-layer 121 and the second electron transport sub-layer 122 are doped ZnO thin films formed by spluttering, the first electron transport sub-layer 121 and the second electron transport sub-layer 122 may adopt different doping materials, so that the energy level of conduction band minimum of the second electron transport sub-layer 122 is greater than that of the first electron transport sub-layer 121 and less than that of the quantum dot light emitting layer 110.

In some examples, as illustrated by FIG. 10, the quantum dot light emitting structure 100 may further include a hole transport layer 150, a hole injection layer 160, and a second electrode 170. The first electrode 140 may be a cathode, and the second electrode 170 may be an anode.

Figure 12:
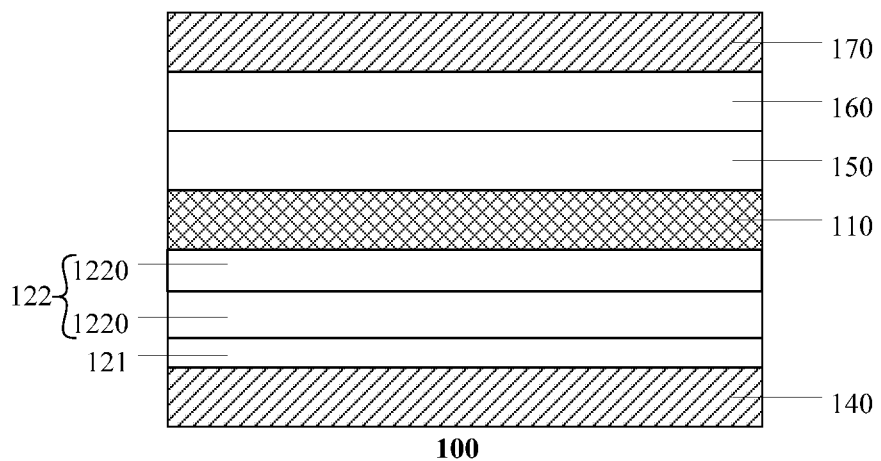
FIG. 12 is a schematic diagram of another quantum dot light emitting structure provided by an embodiment of the present disclosure.
Figure 13:
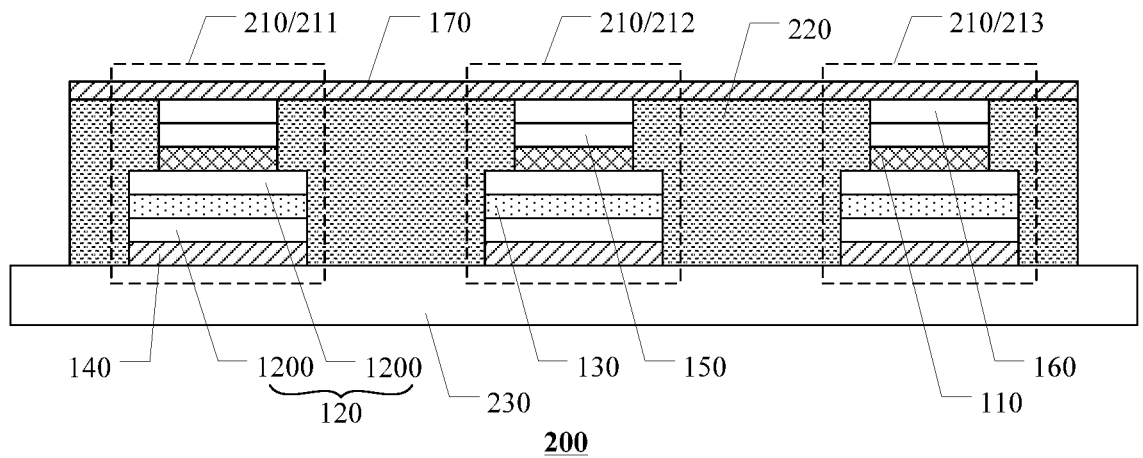
FIG. 13 is a schematic diagram of an array substrate according to an embodiment of the present disclosure.

FIG. 12 is a schematic diagram of another quantum dot light emitting structure according to an embodiment of the present disclosure. As illustrated by FIG. 12, the second electron transport sub-layer 122 includes a plurality of doped electron transport sub-layers 1220, and doping concentrations of the plurality of doped electron transport sub-layers 1220 each are gradually increased in a direction from a first electron transport sub-layer 121 to a quantum dot light emitting layer 110. That is to say, the second electron transport sub-layer 122 includes a plurality of doped electron transport sub-layers 1220 with doping concentrations in gradient change, the doping concentrations of the plurality of doped electron transport sub-layers 1220 each are gradually increased in a direction from the first electron transport sub-layer to the quantum dot light emitting layer. Similarly, with an increase of the doping concentration, an LUMO energy level of the doped ZnO thin film may be increased. Because the doping concentrations of the plurality of doped transport sub-layers each are gradually increased in a direction from the first electron transport sub-layer to the quantum dot light emitting layer, energy level matching may be better achieved, and improvement of a luminous efficiency of the quantum dot light emitting structure may be facilitated. FIG. 13 is a schematic diagram of an array substrate according to an embodiment of the present disclosure. As illustrated by FIG. 13, the array substrate 200 includes a plurality of light emitting elements 210, and at least one of the light emitting elements 210 adopts the quantum dot light emitting structure 100 provided by the above-mentioned embodiments. Because the at least one light emitting element in the array substrate adopts the quantum dot light emitting structure provided by the above-mentioned embodiments, the array substrate has high luminous efficiency and current efficiency, and also has a low turn-on voltage.

For example, as show in FIG. 13, each of the light emitting elements 210 includes an electron blocking layer 130 located in an electron transport layer 120. For example, the electron transport layer 120 includes two electron transport sub-layers 1200, and the electron blocking layer 130 is arranged between the two electron transport sub-layers 1200. By adding the electron blocking layer in the electron transport layer, in the light emitting element, electrons injected into the electron transport layer from an electrode may be reduced when the electron transport layer has a high mobility, so that a carrier concentration of a quantum dot light emitting layer may be balanced, and a luminous efficiency of the quantum dot light emitting structure may be improved. A turn-on voltage may be effectively reduced by arranging the electron blocking layer in the electron transport layer.

In some examples, as illustrated by FIG. 13, the array substrate 200 further includes a pixel definition layer 220 that is arranged around the light emitting elements 210, covers edges of the electron transport layers 120 of the light emitting elements 210, and has openings that expose middles of the electron transport sub-layers 120. In such case, area of each opening on the pixel definition layer is smaller than area of the electron transport layer of each light emitting element. In such case, the pixel definition layer 220 may provide the openings that are used to form functional film layers such as the quantum dot light emitting layer, the hole transport layer, the hole injection layer, and the quantum dot light emitting layer, and may also shield defects (such as burrs) at the edges of the formed electron transport layers, so that the film layers formed subsequently may have better flatness.

For example, as illustrated by FIG. 13, a width of an overlapped portion of an orthographic projection, on a substrate 230, of the pixel definition layer 220 and an orthographic projection, on the substrate 230, of the electron transport layer 120 of each light emitting element 210 may be within a range of 1 nm to 5 nm. However, the embodiment of the present disclosure includes, but is not limited to this. The area of each opening on the pixel definition layer may also be equal to the area of the electron transport layer of each light emitting element.

In some examples, as illustrated by FIG. 13, the array substrate 200 further includes a substrate 230. The substrate may be a glass substrate, a quartz substrate, or a flexible polyethylene glycol terephthalate (PET) substrate.

Figure 14:
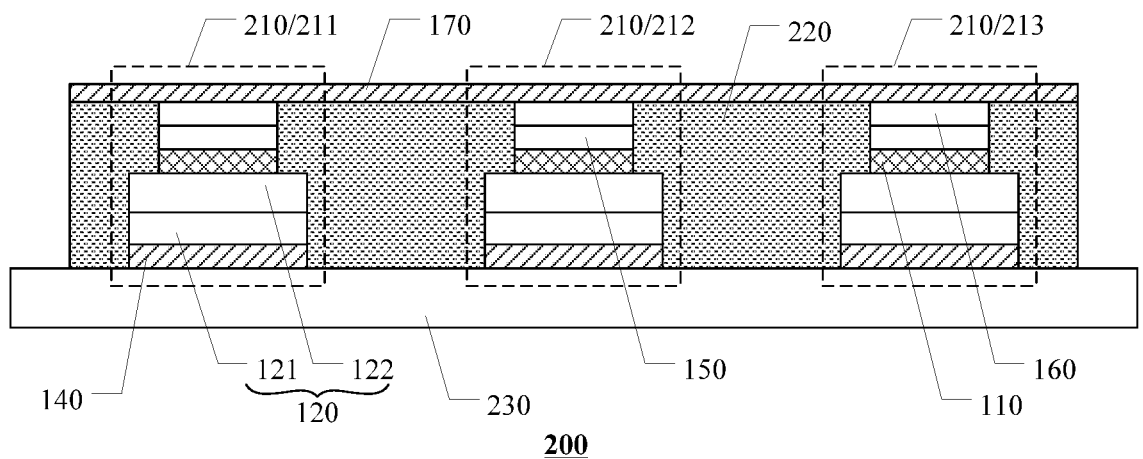
FIG. 14 is a schematic diagram of another array substrate according to an embodiment of the present disclosure.

FIG. 14 is a schematic diagram of an array substrate according to an embodiment of the present disclosure. As illustrated by FIG. 14, electron transport layers 120 each include a first electron transport sub-layer 121 and a second electron transport sub-layer 122, where the second electron transport sub-layer 122 is arranged on a side, close to a quantum dot light emitting layer 110, of the first electron transport sub-layer 121, and an energy level of conduction band minimum of the second electron transport sub-layer 122 is greater than that of the first electron transport sub-layer 121 and less than that of the quantum dot light emitting layer 110; the first electron transport sub-layer 121 is a ZnO thin film formed by spluttering, and the second electron transport sub-layer 122 is a Mg-doped ZnO thin film. A plurality of light emitting elements 210 include light emitting elements of different colors, doping concentrations of the second electron transport sub-layers in the light emitting elements of different colors are different, so that energy level matching may be better achieved.

In some examples, as illustrated by FIG. 14, the plurality of light emitting elements 210 include a red light emitting element 211, a green light emitting element 212, and a blue light emitting element 213, where a doping concentration of Mg in the second electron transport sub-layer 122 in the red light emitting element 211 is 1% to 5%, a doping concentration of Mg in the second electron transport sub-layer 122 in the green light emitting element 212 is 5% to 10%, and the doping concentration of Mg in the second electron transport sub-layer 122 in the blue light emitting element 213 is 10% to 20%, so that the energy level matching may be better achieved.

Figure 15:
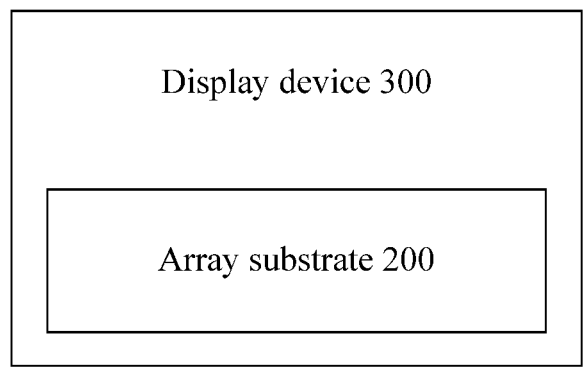
FIG. 15 is a schematic diagram of a display device according to an embodiment of the present disclosure.

FIG. 15 is a schematic diagram of a display device according to an embodiment of the present disclosure. As illustrated by FIG. 15, the display device 300 includes the above-mentioned array substrate. Because the display device includes the above-mentioned array substrate, the display device has high luminous efficiency and current efficiency, and also has a low turn-on voltage.

In some examples, the display device may be an electronic device having a display function, such as a TV, a computer, a smart phone, a tablet computer, a navigator, and an electronic frame.

An embodiment of the present disclosure further provides a method for manufacturing a quantum dot light emitting structure. The method for manufacturing the quantum dot light emitting structure includes: forming a first electrode, forming an electron transport layer on the first electrode, and forming a quantum dot light emitting layer on a side, away from the first electrode, of the electron transport layer. The method further includes forming an electron blocking layer in the electron transport layer.

In the method for manufacturing the quantum dot light emitting structure provided by the embodiment of the present disclosure, by forming the electron blocking layer in the electron transport layer or between the electron transport layer and the first electrode, electrons injected into the electron transport layer from the electrode may be reduced when the electron transport layer has a high mobility, so that a carrier concentration of the quantum dot light emitting layer may be balanced, and a luminous efficiency of the quantum dot light emitting structure manufactured by the method may be improved. A turn-on voltage may be effectively reduced by forming the electron blocking layer in the electron transport layer.

In some examples, forming the electron transport layer on the first electrode includes: forming the electron transport layer on the first electrode by a sputtering process. The electron transport layer (such as a ZnO thin film) formed by the spluttering process contains less impurities or even contains no impurities, and accordingly has high compactness and flatness. Thus, the electron transport layer formed in this way may have high compactness and flatness, thereby facilitating improvement of the flatness of the quantum dot light emitting layer formed later, to improve flatness and luminous performance of the quantum dot light emitting structure finally formed. That is to say, the quantum dot light emitting structure may have high flatness and luminous performance, as well as high luminous efficiency.

In some examples, forming the electron blocking layer in the electron transport layer includes: forming the electron blocking layer in the electron transport layer by the sputtering process. Similarly, the electron blocking layer formed by the spluttering process also has high compactness and flatness, thereby facilitating improvement of the flatness of the quantum dot light emitting layer formed later, to improve the flatness and luminous performance of the quantum dot light emitting structure finally formed.

In some examples, the electron transport layer includes two electron transport sub-layers, and forming the electron blocking layer in the electron transport layer includes: forming the electron blocking layer between the two electron transport sub-layers. Thus, the method may reduce the turn-on voltage. However, the embodiment of the present disclosure includes, but is not limited to this. The electron blocking layer may be formed, in other ways, in the electron transport layer.

In some examples, the electron transport layer includes N+1 electron transport sub-layers, and forming the electron blocking layer in the electron transport layer includes: forming N electron blocking sub-layers among the N+1 electron transport sub-layers, where N is a positive integer equal to or greater than 2. Thus, by dividing the single electron blocking layer into a plurality of electron blocking sub-layers that are thinner, and arranging the electron blocking sub-layers among the plurality of electron transport sub-layers, the turn-on voltage may be further reduced.

In some examples, forming the electron blocking layer in the electron transport layer includes: forming the N electron blocking layer by different materials. For example, when the electron blocking layer includes two electron blocking sub-layers, an Al2O3 material is used to manufacture one of the two electron blocking sub-layers, and a TaOx material is used to manufacture the other one of the two electron blocking sub-layers.

In some examples, forming the electron transport layer on the electrode includes: forming the first electron transport sub-layer and the second electron transport sub-layer by the spluttering process, where the second electron transport sub-layer is located on a side, close to the quantum dot light emitting layer, of the first electron transport sub-layer, and an energy level of conduction band minimum of the second electron transport sub-layer is greater than that of the first electron transport sub-layer and less than that of the quantum dot light emitting layer.

In the method for manufacturing the quantum dot light emitting structure provided in the examples, the energy level of conduction band minimum of the second electron transport sub-layer is greater than that of the first electron transport sub-layer and less than that of the quantum dot light emitting layer, so that an LUMO energy level of the second electron transport sub-layer is closer to that of the quantum dot light emitting layer, energy level matching may be better achieved, and improvement of the luminous efficiency of the quantum dot light emitting structure manufactured by the method is facilitated. In addition, the first electron transport sub-layer and the second electron transport sub-layer are formed by the spluttering process. In such case, the first electron transport sub-layer and the second electron transport sub-layer may have high compactness, thereby facilitating improvement of the flatness of the quantum dot light emitting layer formed later, to improve flatness and luminous performance of the quantum dot light emitting structure finally formed. That is to say, the quantum dot light emitting structure may have high flatness and luminous performance, as well as high luminous efficiency.

In some examples, forming the quantum dot light emitting layer on a side, away from the electrode, of the electron transport layer, includes: forming the quantum dot light emitting layer on a side, away from the electrode, of the electron transport layer by an ink-jet printing process. The embodiment of the present disclosure includes, but is not limited to this, and the quantum dot light emitting layer may be formed by other technologies, such as a spin-coating process or a photolithographic process.

In some examples, after the electron transport layer and the electron blocking layer are formed on the first electrode, and before the quantum dot light emitting layer is formed on a side, away from the electrode, of the electron transport layer, the method further includes: forming a pixel definition layer on a side, away from the substrate, of the electron transport layer, where the pixel definition layer includes openings that expose the electron transport layers; forming the quantum dot light emitting layer on a side, away from the electrode, of the electron transport layer includes: forming the quantum dot light emitting layer in the openings by the ink-jet printing process. In the method, the pixel definition layer with the openings is formed firstly, so that a range of the quantum dot light emitting layers manufactured subsequently may be defined effectively. The pixel definition layer may provide the openings that are used to form the quantum dot light emitting layers, and may also shield defects (such as burrs) at the edges of the formed electron transport layers, so that the film layers formed subsequently may have better flatness.

In some examples, the method for manufacturing the quantum dot light emitting structure further includes: by an evaporation process, forming a hole transport layer, a hole injection layer, and a second electrode in each opening, and on a side, away from each substrate, of each quantum dot light emitting layer. For example, the first electrode may be an anode, and the second electrode may be a cathode. However, the embodiment of the present disclosure includes, but is not limited to this. The first electrode may also be a cathode, and the second electrode may be an anode.

In some examples, the method for manufacturing the quantum dot light emitting structure further includes: by a plasma etching or sandblasting treatment process, roughening a surface, close to the quantum dot light emitting layer, of the electron transport layer, wherein a range of the RMS roughness of the treated surface, close to the quantum dot light emitting layer, of the electron transport layer, is 5 nm to 10 nm. Thus, the roughness of the surface, close to the quantum dot light emitting layer, of the electron transport layer is high, so that contact between quantum dots in the quantum dot light emitting layer and the electron transport layer is increased, the quantum dots in a state of nanoparticles are prevented from accumulating on the smooth ZnO surface, and electric leakage caused by a small contact area or by direct contact between a part of an inverted electron transport layer and a follow-up hole transport layer is avoided.

An embodiment of the present disclosure further provides a method for manufacturing another quantum dot light emitting structure. The method for manufacturing the quantum dot light emitting structure includes: forming an electrode, forming an electron transport layer on the electrode, and forming a quantum dot light emitting layer on a side, away from the electrode, of the electron transport layer, where the electron transport layer includes a doped ZnO thin film formed by spluttering. In this arrangement, because the doped ZnO thin film is formed by a spluttering process, an energy level of conduction band minimum of the electron transport layer is greater than that of a common ZnO thin film that is formed by the spluttering process. Thus, in the quantum dot light emitting structure manufactured by the method, the energy level of conduction band minimum of the electron transport layer is closer to an LUMO energy level of the quantum dot light emitting layer, so that energy level matching may be better achieved, and improvement of a luminous efficiency of the quantum dot light emitting structure may be facilitated. In addition, the ZnO thin film, formed by a spluttering process, is a thin film in an amorphous or polycrystalline state, the ZnO thin film or the doped ZnO thin film, formed by spluttering, has high compactness and flatness, thereby facilitating improvement of the flatness of the quantum dot light emitting layer formed later, to improve flatness and luminous performance of the quantum dot light emitting structure finally formed. That is to say, the quantum dot light emitting structure may have high flatness and luminous performance, as well as high luminous efficiency.

In some examples, forming the electron transport layer by the spluttering process on the electrode includes: on conditions that a valve range of an argon flow is about 30 sccm to 50 sccm, such as 40 sccm, and a sputtering power is about 90 W to 110 w, such as 100 W, forming the ZnO thin film on the electrode by a ZnO target. The embodiment of the present disclosure includes, but is not limited to this. Specific parameters of the spluttering process may be set according to actual conditions. It should be noted that the above-mentioned "a range of an argon flow is about 30 sccm to 50 sccm" indicates that a lower limit of the argon flow is within an error range of 10% of 30 sccm, and an upper limit of the argon flow is within an error range of 10% of 50 sccm; the above-mentioned "a range of a spluttering power is about 90 W to 110 W" indicates that a lower limit of the spluttering power is within an error range of 10% of 90 W, and an upper limit of the spluttering power is within an error range of 10% of 110 W.

In some examples, forming the electron transport layer by the spluttering process on the electrode includes: forming the first electron transport sub-layer and the second electron transport sub-layer by the spluttering process, where the second electron transport sub-layer is arranged on a side, close to the quantum dot light emitting layer, of the first electron transport sub-layer, and an energy level of conduction band minimum of the second electron transport sub-layer is greater than that of the first electron transport sub-layer and less than that of a quantum dot light emitting layer. The energy level of conduction band minimum of the second electron transport sub-layer is greater than that of the first electron transport sub-layer and less than that of the quantum dot light emitting layer, so that the LUMO energy level of the second electron transport sub-layer is closer to that of the quantum dot light emitting layer, energy level matching may be better achieved, and improvement of the luminous efficiency of the quantum dot light emitting structure may be facilitated.

For example, the first electron transport sub-layer may be the ZnO thin film formed by the spluttering process, and the second electron transport sub-layer may be the doped ZnO thin film formed by the spluttering process.

In some examples, a doping concentration of the second electron transport sub-layer is gradually increased, from a side, close to the first electron transport sub-layer, of the second electron transport sub-layer to a side, close to the quantum dot light emitting layer, of the second electron transport sub-layer. With an increase of the doping concentration, the LUMO energy level of the doped ZnO thin film may be increased. The doping concentration of the second transport sub-layer is gradually increased from a side, close to the first electron transport sub-layer, of the second electron transport sub-layer, to a side, close to the quantum dot light emitting layer, of the second electron transport sub-layer, so that energy level matching may be better achieved, and improvement of the luminous efficiency of the quantum dot light emitting structure may be facilitated.

In some examples, forming the second electron transport sub-layer by the spluttering process includes: forming a plurality of doped electron transport sub-layers, with different doping concentrations, on a side, close to the quantum dot light emitting layer, of the first electron transport sub-layer, where the plurality of doped electron transport sub-layers form the second electron transport sub-layer, doping concentrations of the plurality of doped electron transport sub-layers each are gradually increased in a direction from the first electron transport sub-layer to the quantum dot light emitting layer. Thus, the second electron transport sub-layer includes a plurality of doped electron transport sub-layers with doping concentrations in gradient change, the doping concentrations of the plurality of doped electron transport sub-layers each are gradually increased in a direction from the first electron transport sub-layer to the quantum dot light emitting layer. Similarly, with an increase of the doping concentration, the LUMO energy level of the doped ZnO thin film may be increased. Because the doping concentrations of the plurality of doped transport sub-layers each are gradually increased in a direction from the first electron transport sub-layer to the quantum dot light emitting layer, energy level matching may be better achieved, and improvement of the luminous efficiency of the quantum dot light emitting structure may be facilitated.

An embodiment of the present disclosure further provides a method for manufacturing an array substrate. The method includes the following steps S301 to S306.

At S301, a first electrode is formed on a substrate.

For example, the substrate may be a glass substrate, a quartz substrate, or a flexible PET substrate; the first electrode may be a transparent electrode, such as ITO, FTO (fluoride-doped tin oxide), or a conducting polymer, and may also be an untransparent electrode, such as Al or Ag.

At S302, an electron transport layer is formed on the first electrode by a sputtering process.

For example, a ZnO thin film or a ZnO thin film doped with Mg, Al, Zr, Hf, and Y may be formed on the electrode by a magnetron sputtering process. In addition, a thickness of the electron transport layer may range from 50 nm to 300 nm.

At S303, a pixel definition layer is formed on the substrate and the electron transport layer, where the pixel definition layer covers edges of each electron transport layer, and has an opening that exposes a middle of the electron transport layer.

At S304, in an opening of the pixel definition layer, a quantum dot light emitting layer is formed, on a side, away from the first electrode, of the electron transport layer.

For example, the quantum dot light emitting layer is formed by an ink-jet printing process.

At S305, a hole transport layer and a hole injection layer are sequentially formed.

At S306, a second electrode is formed on a side, away from the hole transport layer, of the hole injection layer.

The following points need to be noted:

(1) In the drawings of the embodiments of the present disclosure, only the structures related to the embodiments of the present disclosure are involved, and other structures may refer to the common design(s).

(2) In case of no conflict, features in one embodiment or in different embodiments of the present disclosure can be combined.

The above are merely particular embodiments of the present disclosure but are not limitative to the scope of the present disclosure; the scopes of the present disclosure should be defined in the appended claims.

What is claimed is:

1. A quantum dot light emitting structure, comprising:
   a quantum dot light emitting layer;
   an electrode; and
   an electron transport layer located between the quantum dot light emitting layer and the electrode,
   wherein the quantum dot light emitting structure further comprises an electron blocking layer located in the electron transport layer,
   the electron transport layer comprises a first electron transport sub-layer and a second electron transport sub-layer, the second transport sub-layer is arranged on a side, close to the quantum dot light emitting layer, of the first electron transport sub-layer, and an energy level of conduction band minimum of the second electron transport sub-layer is greater than that of the first electron transport sub-layer and less than an energy level of conduction band minimum of the quantum dot light emitting layer, the second electron transport sub-layer comprises a plurality of doped electron transport sub-layers, the electron blocking layer comprises a first electron blocking sub-layer and a second electron blocking sub-layer, the first electron blocking sub-layer is located between the first electron transport sub-layer and the second electron transport sub-layer, and the second electron blocking sub-layer is located between two of the plurality of doped electron transport sub-layers in the second electron transport sub-layer.

2. The quantum dot light emitting structure according to claim 1, wherein the electron transport layer comprises a zinc oxide (ZnO) thin film.

3. The quantum dot light emitting structure according to claim 1, wherein an energy level of conduction band minimum of the electron blocking layer is greater than an energy level of conduction band minimum of the quantum dot light emitting layer.

4. The quantum dot light emitting structure according to claim 1, wherein a luminance of the quantum dot light emitting structure under a voltage of 7V is greater than 500 cd/m$^2$.

5. The quantum dot light emitting structure according to claim 1, wherein a range of a root-mean-square (RMS) roughness of a surface, close to the quantum dot light emitting layer, of the electron transport layer, is about 5 to 10 nm.

6. The quantum dot light emitting structure according to claim 1, wherein the first electron transport sub-layer is a ZnO thin film, and the second electron transport sub-layer is a doped ZnO thin film.

7. The quantum dot light emitting structure according to claim 6, wherein a doping concentration of the second electron transport sub-layer is gradually increased, from a side, close to the first electron transport sub-layer, of the second electron transport sub-layer, to a side, close to the quantum dot light emitting layer, of the second electron transport sub-layer.

8. The quantum dot light emitting structure according to claim 6, wherein doping concentrations of the plurality of doped electron transport sub-layers are gradually increased in a direction from the first electron transport sub-layer to the quantum dot light emitting layer.

9. An array substrate, comprising a plurality of light emitting elements,
wherein at least one of the light emitting elements adopts the quantum dot light emitting structure according to claim 1.

10. The array substrate according to claim 9, wherein the first electron transport sub-layer is a ZnO thin film, and the second electron transport sub-layer is a doped ZnO thin film;
the plurality of light emitting elements comprise light emitting elements of different colors, and doping concentrations of the second transport sub-layers, in the light emitting elements of different colors, are different.

11. The array substrate according to claim 9, wherein a dopant of the doped ZnO thin film is Mg, the plurality of light emitting elements comprise a red light emitting element, a green light emitting element, and a blue light emitting element, a doping concentration of Mg, in the second electron transport sub-layer, of the red light emitting element is 1% to 5%, a doping concentration of Mg, in the second electron transport sub-layer, of the green light emitting element is 5% to 10%, and a doping concentration of Mg, in the second electron transport sub-layer, of the blue light emitting element is 10% to 20%.

12. A display device, comprising the array substrate according to claim 9.

13. A method for manufacturing a quantum dot light emitting structure, comprising:
forming a first electrode;
forming an electron transport layer on the first electrode; and
forming a quantum dot light emitting layer, on a side, away from the first electrode, of the electron transport layer,
wherein the method further comprises forming an electron blocking layer in the electron transport layer,
the electron transport layer comprises a first electron transport sub-layer and a second electron transport sub-layer, the second transport sub-layer is arranged on a side, close to the quantum dot light emitting layer, of the first electron transport sub-layer, and an energy level of conduction band minimum of the second electron transport sub-layer is greater than that of the first electron transport sub-layer and less than an energy level of conduction band minimum of the quantum dot light emitting layer, the second electron transport sub-layer comprises a plurality of doped electron transport sub-layers,
the electron blocking layer comprises a first electron blocking sub-layer and a second electron blocking sub-layer, the first electron blocking sub-layer is located between the first electron transport sub-layer and the second electron transport sub-layer, and the second electron blocking sub-layer is located between two of the plurality of doped electron transport sub-layers in the second electron transport sub-layer.

14. The method for manufacturing the quantum dot light emitting structure according to claim 13, wherein forming the electron transport layer on the first electrode comprises:
forming the electron transport layer on the first electrode by a sputtering process.

15. The method for manufacturing the quantum dot light emitting structure according to claim 13, wherein forming the electron blocking layer in the electron transport layer comprises:
forming the electron blocking layer in the electron transport layer by a sputtering process.

16. The method for manufacturing the quantum dot light emitting structure according to claim 13, further comprising:
roughening a surface, close to the quantum dot light emitting layer, of the electron transport layer by a plasma etching or sandblasting treatment process, wherein a range of a root-mean-square (RMS) roughness of the treated surface, close to the quantum dot light emitting layer, of the electron transport layer, is 5 nm to 10 nm.

* * * * *